(12) United States Patent
Langa et al.

(10) Patent No.: US 11,186,478 B2
(45) Date of Patent: Nov. 30, 2021

(54) MEMS AND METHOD OF MANUFACTURING THE SAME

(71) Applicant: Fraunhofer-Gesellschaft zur Förderung der angewandten Forschung e.V., Munich (DE)

(72) Inventors: Sergiu Langa, Dresden (DE); Holger Conrad, Dresden (DE); Klaus Schimmanz, Cottbus (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 133 days.

(21) Appl. No.: 16/550,823

(22) Filed: Aug. 26, 2019

(65) Prior Publication Data

US 2019/0382257 A1    Dec. 19, 2019

Related U.S. Application Data

(63) Continuation of application No. PCT/EP2018/055349, filed on Mar. 5, 2019.

(30) Foreign Application Priority Data

Mar. 7, 2017   (DE) ..................... 10 2017 203 722.9

(51) Int. Cl.
  *B81B 3/00* (2006.01)
  *B81C 1/00* (2006.01)
(52) U.S. Cl.
  CPC ........ *B81B 3/0056* (2013.01); *B81C 1/00166* (2013.01); *B81B 2201/0257* (2013.01);
  (Continued)

(58) Field of Classification Search
  CPC ..................................................... B81B 3/051
  See application file for complete search history.

(56) References Cited

U.S. PATENT DOCUMENTS

| | | |
|---|---|---|
| 4,906,840 A | 3/1990 | Zdeblick et al. |
| 5,075,548 A | 12/1991 | Kajimura |

(Continued)

FOREIGN PATENT DOCUMENTS

| | | |
|---|---|---|
| DE | 40 22 711 A1 | 1/1991 |
| DE | 689 18 088 T2 | 4/1995 |

(Continued)

OTHER PUBLICATIONS

Google Patent NPL Search.*

(Continued)

*Primary Examiner* — Moazzam Hossain
(74) *Attorney, Agent, or Firm* — McClure, Qualey & Rodack, LLP

(57) ABSTRACT

A MEMS includes a substrate having a cavity, and a moveable element arranged in the cavity, the moveable element including a first electrode, a second electrode and a third electrode that is arranged between the first electrode and the second electrode and is fixed in an electrically insulated manner from the same at discrete areas. The moveable element is configured to perform a movement along a movement direction in a substrate plan in response to an electric potential between the first electrode and the third electrode or in response to an electric potential between the second electrode and the third electrode. A dimension of the third electrode perpendicular to the substrate plane is lower than a dimension of the first electrode and a dimension of the second electrode perpendicular to the substrate plane.

18 Claims, 23 Drawing Sheets

(52) U.S. Cl.
    CPC . *B81B 2201/038* (2013.01); *B81B 2203/0163* (2013.01); *B81B 2203/0315* (2013.01); *B81B 2203/04* (2013.01); *B81B 2203/051* (2013.01); *B81C 2201/0132* (2013.01)

(56) References Cited

U.S. PATENT DOCUMENTS

| | | |
|---|---|---|
| 2004/0056742 A1 | 3/2004 | Dabbaj |
| 2012/0017693 A1* | 1/2012 | Robert .................. H04R 11/04 73/753 |
| 2013/0301101 A1 | 11/2013 | Conrad et al. |
| 2016/0173001 A1 | 6/2016 | Langa et al. |
| 2016/0304333 A1 | 10/2016 | Gaudet et al. |
| 2018/0179048 A1* | 6/2018 | Schenk ............... B81C 1/00158 |

FOREIGN PATENT DOCUMENTS

| | | |
|---|---|---|
| DE | 10 2010 029 936 A1 | 12/2011 |
| DE | 10 2014 225 934 B4 | 6/2016 |
| DE | 10 2015 206 774 B4 | 10/2016 |
| DE | 10 2015 210 919 A1 | 12/2016 |
| EP | 0 611 967 A1 | 8/1994 |
| EP | 2 664 058 A1 | 11/2013 |
| WO | 2012/095185 A1 | 7/2012 |

OTHER PUBLICATIONS

International Search Report and Written Opinion issued in application No. PCT/EP2018/055349.
English language translation of search report.

\* cited by examiner

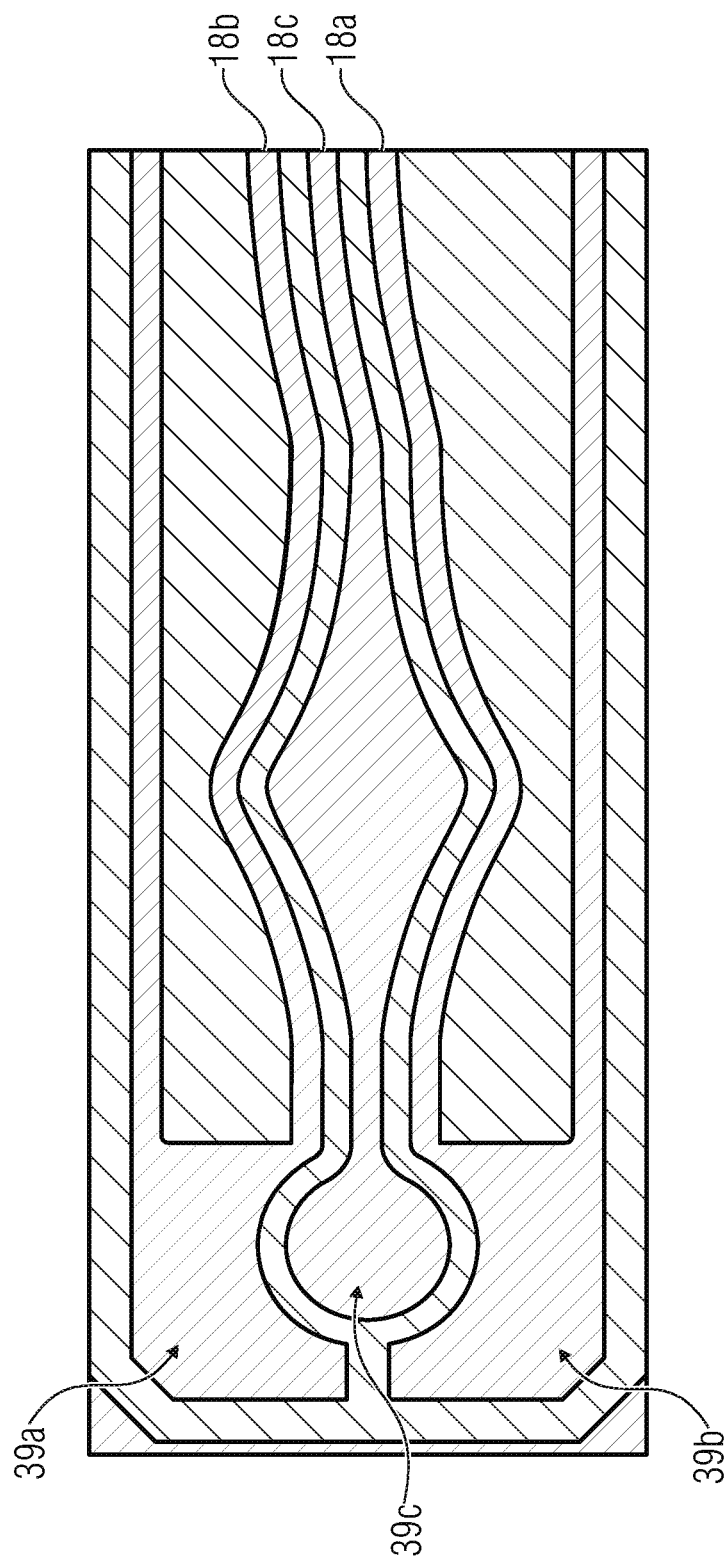

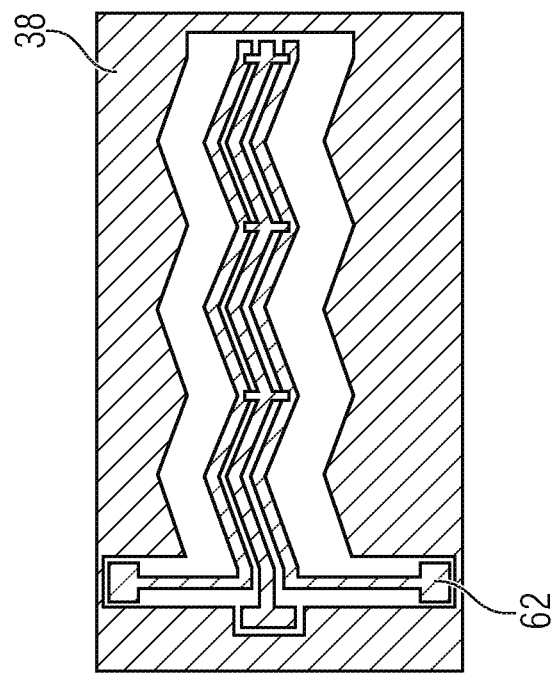
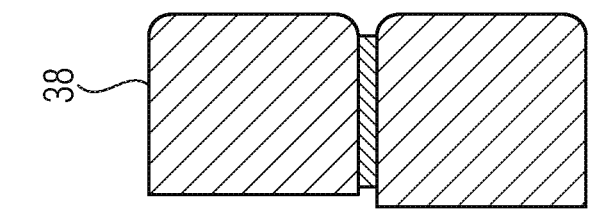
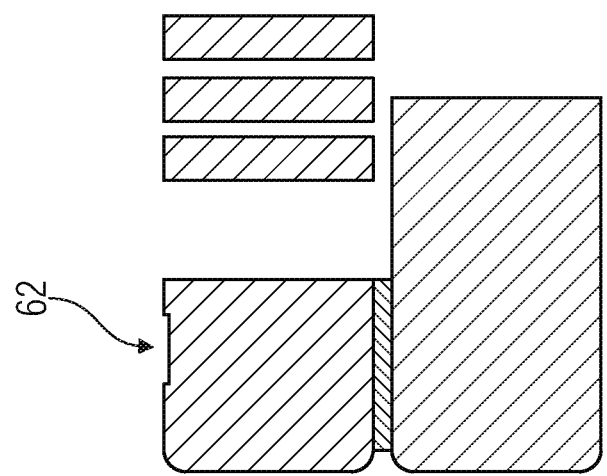
Fig. 6p
Fig. 6o

MEMS AND METHOD OF MANUFACTURING THE SAME

CROSS-REFERENCES TO RELATED APPLICATIONS

This application is a continuation of copending International Application No. PCT/EP2018/055349, filed Mar. 5, 2018, which is incorporated herein by reference in its entirety, and additionally claims priority from German Application No. DE 10 2017 203 722.9, filed Mar. 7, 2017, which is incorporated herein by reference in their entirety.

BACKGROUND OF THE INVENTION

The present invention refers to microelectromechanical actuators (MEMS) which may be (laterally) moved in the chip plane, wherein the occurrence of a vertical pull-in effect is difficult and/or wherein large dimensions in the thickness direction are possible. This invention also relates to methods for manufacturing such MEMS. The invention relates in particular to the recess of a voltage-regulated electrode of a laterally deflectable, electrostatic bending actuator LNED (Lateral Nanoscopic Electrostatic Drive) for avoiding vertical pull-in effects in the encapsulation of LNED actuators.

Nanoscopic Electrostatic Drive (NED) actuators may have vertical (VNED) or lateral (LNED) configurations. For example, NEDs may be used for MEMS loudspeakers. The MEMS loudspeaker based on LNED may be manufactured by 3D integration using wafer bonding. The LNED actuator moves laterally, i.e. in a substrate plane. When the LNED device is supplied with a control voltage, an electrical voltage difference occurs between differently charged areas. On the one hand, the voltage difference is used for the operation of the electrostatic bending actuator LNED and is therefore not elementarily necessary. On the other hand, the voltage difference may lead to a vertical pull-in effect between the LNED actuator and the bonded top substrate or bottom substrate. Pull-in effects are not desired, since the LNED actuator comes into mechanical contact with the top substrate or base substrate in this case, which may lead to functional disturbances and total failure of the device. This includes mechanical rubbing or "sticking", i.e. mechanical and final attachment of the actuators to the bottom wafer or top wafer. The bottom wafer or top wafer may be arranged in vertical direction so that this effect may be described as a vertical pull-in effect. The term vertical refers to the arrangement in the layer stack direction but does not have a restrictive effect.

Although concepts exist to avoid the pull-in effect by shielding the control potential, on the other hand, efforts are being made to keep a distance between movable elements and the surrounding substrate as small as possible, so that small losses occur due to the fluid (gaseous such as air, or a liquid) to be moved flowing around the LNED actuators, which increases the danger of the pull-in effect due to the small distance.

Another disadvantage of current actuators is their low thickness. Current actuators have a thickness of only between 10 and 75 µm. This is detrimental to the functionality of the device as a loudspeaker because comparatively little air is moved with the lateral movement of the LNED actuator. Furthermore, such thin structures have a low vertical bending stiffness. This leads to an increase in the danger of the vertical pull-in effect.

For example, WO 2012/095185 A1 describes MEMS loudspeakers. The problems listed there also apply to MEMS-based micropumps.

A concept that at least reduces the risk of a vertical pull-in effect for MEMS actuators would therefore be desirable.

SUMMARY

According to an embodiment, a MEMS may have a substrate including a cavity; a moveable element arranged in the cavity, the moveable element including a first electrode, a second electrode and a third electrode that is arranged between the first electrode and the second electrode and is fixed in an electrically insulated manner from the same at discrete areas; wherein the moveable element is configured to perform a movement along a movement direction in a substrate plan in response to an electric potential between the first electrode and the third electrode or in response to an electric potential between the second electrode and the third electrode; wherein a dimension of the third electrode perpendicular to the substrate plane is lower than a dimension of the first electrode and a dimension of the second electrode perpendicular to the substrate plane.

According to another embodiment, a MEMS may have a substrate including a cavity; a moveable element arranged in the cavity, the moveable element including a first electrode connected to the substrate, a second electrode connected to the substrate and a third electrode that is arranged between the first electrode and the second electrode and is connected to the substrate, the third electrode being fixed with the first electrode and the second electrode in an electrically insulated manner with a fixation at discrete areas; wherein the moveable element is configured to perform a movement along a movement direction in a substrate plan in response to an electric potential between the first electrode and the third electrode or in response to an electric potential between the second electrode and the third electrode; wherein the first electrode and the second electrode are under mechanical tension in a state without the electric potential so that the first electrode and the second electrode move away from the third electrode as a result of separating the fixation or are held with respect to the third electrode by means of a multi-stable structure.

According to another embodiment, a MEMS may have a substrate including a cavity; a moveable element arranged in the cavity, the moveable element including a first electrode, a second electrode, and a third electrode that is arranged between the first electrode and the second electrode, the third electrode being fixed with the first electrode and the second electrode in an electrically insulated manner with a fixation at discrete areas; wherein the moveable element is configured to perform a movement along a movement direction in a substrate plan in response to an electric potential between the first electrode and the third electrode or in response to an electric potential between the second electrode and the third electrode; wherein the first electrode and the second electrode are spaced apart from the third electrode by means of a functional layer and are connected in a mechanically fixed manner at the discrete areas; wherein at least one of the first electrode, the second electrode and the third electrode is connected to the substrate via a spring element; wherein at least one of the first electrode, the second electrode and the third electrode is connected to the substrate exclusively indirectly via a neighboring electrode.

According to another embodiment, a MEMS may have a substrate including a cavity; a moveable element arranged in the cavity, the moveable element including a first electrode, a second electrode, and a third electrode that is arranged between the first electrode and the second electrode, the third electrode being fixed with the first electrode and the second electrode in an electrically insulated manner with a fixation at discrete areas; wherein the moveable element is configured to perform a movement along a movement direction in a substrate plan in response to an electric potential between the first electrode and the third electrode or in response to an electric potential between the second electrode and the third electrode; wherein the first electrode and the second electrode are spaced apart from the third electrode by means of a functional layer and are connected in a mechanically fixed manner at the discrete areas; wherein an aspect ratio of a distance between the first electrode and the third electrode and a dimension of the first electrode along a direction perpendicular to the movement direction is larger than 100; or wherein an aspect ratio of a distance between the second electrode and the third electrode and a dimension of the second electrode along the direction perpendicular to the movement direction is larger than 100.

Another embodiment may have a device having an inventive MEMS, the device being configured as an acoustic transducer, a pump, a valve, a dosage system, an acceleration sensor, a rotation rate sensor, a micro-positioning system, a micro-stabilizer or a micro-switch.

According to another embodiment, a method of manufacturing a MEMS may have the steps of: providing a substrate having a first cavity; arranging, in the cavity, a movable element including a first electrode, a second electrode and a third electrode that is arranged between the first electrode and the second electrode so that the third electrode is fixed with the first electrode and the second electrode in an electrically insulated manner at discrete areas; wherein the first, second and third electrodes are arranged such that the movable element performs a movement along a movement direction in a substrate plane in response to an electric potential between the first electrode and the third electrode or in response to an electric potential between the second electrode and the third electrode; wherein the third electrode is arranged such that a dimension of the third electrode perpendicular to the substrate plane is lower than a dimension of the first electrode and a dimension of the second electrode perpendicular to the substrate plane.

According to another embodiment, a method of manufacturing a MEMS may have the steps of: providing a substrate; forming a first electrode in a cavity of the substrate so that the first electrode is suspended from the substrate; forming a second electrode in the cavity of the substrate so that the second electrode is suspended from the substrate; forming a third electrode in the cavity of the substrate between the first electrode and the second electrode; fixing the first electrode, the second electrode and the third electrode with each other and in an electrically insulated manner at discrete areas such that the first, second and third electrodes perform a movement along a movement direction in a substrate plane in response to an electric potential between the first electrode and the third electrode or in response to an electric potential between the second electrode and the third electrode, and such that the first electrode and the second electrode are under mechanical tension in a state without the electric potential so that the first electrode and the second electrode move away from the third electrode as a result of separating the fixation.

According to a first aspect of the present invention, a MEMS includes a substrate comprising a cavity. The MEMS includes a movable member arranged in the cavity including a first electrode, a second electrode, and a third electrode that is arranged between the first and second electrodes and is fixed in an electrically insulated manner from the same at discrete areas. The movable member is configured to move along a movement direction in a substrate plane in response to an electrical potential between the first electrode and the third electrode and/or in response to an electrical potential between the second electrode and the third electrode. A dimension of the third electrode perpendicular to the substrate plane is less than a dimension of the first electrode and a dimension of the second electrode perpendicular to the substrate plane. The smaller dimension of the third electrode perpendicular to the substrate plane and compared to the first electrode and the second electrode makes it possible that occurring field lines and therefore electrostatic attraction forces strike adjacent electrodes, so that a proportion of electrostatic forces on the surrounding substrate, e.g. below and/or above, is small, resulting in low attraction forces as to the substrate and reducing or preventing the occurrence of a vertical pull-in effect. With this, the occurrence of the vertical pull-in effect may be shifted at least into an area that is not disturbing for operation.

A MEMS according to a second aspect of the present invention includes a substrate comprising a cavity. The MEMS includes a movable member arranged in the cavity including a first electrode connected to the substrate, a second electrode connected to the substrate, and a third electrode arranged between the first and second electrodes and connected to the substrate, the third electrode being fixed in an electrically insulated manner with the first electrode and the second electrode with a fixation at discrete areas. The movable member is configured to move along a movement direction a substrate plane in response to an electrical potential between the first electrode and the third electrode and/or in response to an electrical potential between the second electrode and the third electrode. The first electrode and the second electrode are under mechanical tension in a state without the electrical potential so that the first and the second electrode move away from the third electrode as a result of separation of the fixation. The arrangement of the first and second electrodes under the mechanical stress makes it possible to manufacture actuators with a large extension along the direction perpendicular to the substrate plane. Thus, the achievable aspect ratios may be used such that a large dimension along the direction perpendicular to the substrate plane is obtained and resulting gaps may be subsequently reduced using the mechanical stress to obtain an efficient MEMS. The large dimension along the direction perpendicular to the substrate plane allows a high vertical stiffness, which reduces or prevents the occurrence of a vertical pull-in effect. Furthermore, through the high or large dimension along the direction perpendicular to the substrate plane, a large amount of fluid may be moved, increasing the efficiency and power density of the MEMS device.

A method of manufacturing a MEMS according to the first aspect of the present invention includes providing a substrate. The method further includes arranging, in a cavity of the substrate, a movable member including a first electrode, a second electrode and a third electrode arranged between the first and second electrodes so that the third electrode is fixed in an electrically insulated manner with the first and second electrodes at discrete areas. The first, second and third electrodes are arranged such that the movable member, in response to an electrical potential between the first electrode and the third electrode or in response to an electrical potential between the second electrode and the third electrode, performs a movement along a movement direction in a substrate plane. The third electrode is arranged such that a dimension of the third electrode perpendicular to the substrate plane is less than a dimension of the first electrode and a dimension of the second electrode perpendicular to the substrate plane, the third electrode thus comprising a recess or back offset with respect to the first and second electrodes.

A method of manufacturing a MEMS according to the second aspect of the present invention includes providing a substrate. The method further includes forming a first electrode in a cavity of the substrate so that the first electrode is suspended from the substrate. The method includes forming a second electrode in the cavity of the substrate so that the second electrode is suspended from the substrate. The method includes forming a third electrode in the cavity of the substrate between the first electrode and the second electrode. The method includes fixing the first electrode, the second electrode and the third electrode with each other and in an electrically insulated manner at discrete areas so that the first, second and third electrodes move along a movement direction in a substrate plane in response to an electrical potential between the first electrode and the third electrode or in response to an electrical potential between the second electrode and the third electrode, and so that the first electrode and the second electrode are under mechanical stress in a state without the electrical potential so that the first and second electrodes move away from the third electrode as a result of separation of the fixation.

BRIEF DESCRIPTION OF THE DRAWINGS

Embodiments of the present invention will be detailed subsequently referring to the appended drawings, in which:

FIG. 2f shows a schematic view of a usable spring suspension according to an embodiment;

FIGS. 5a to 5l show a manufacturing method of manufacturing MEMS structures according to an embodiment.

Figure 1:
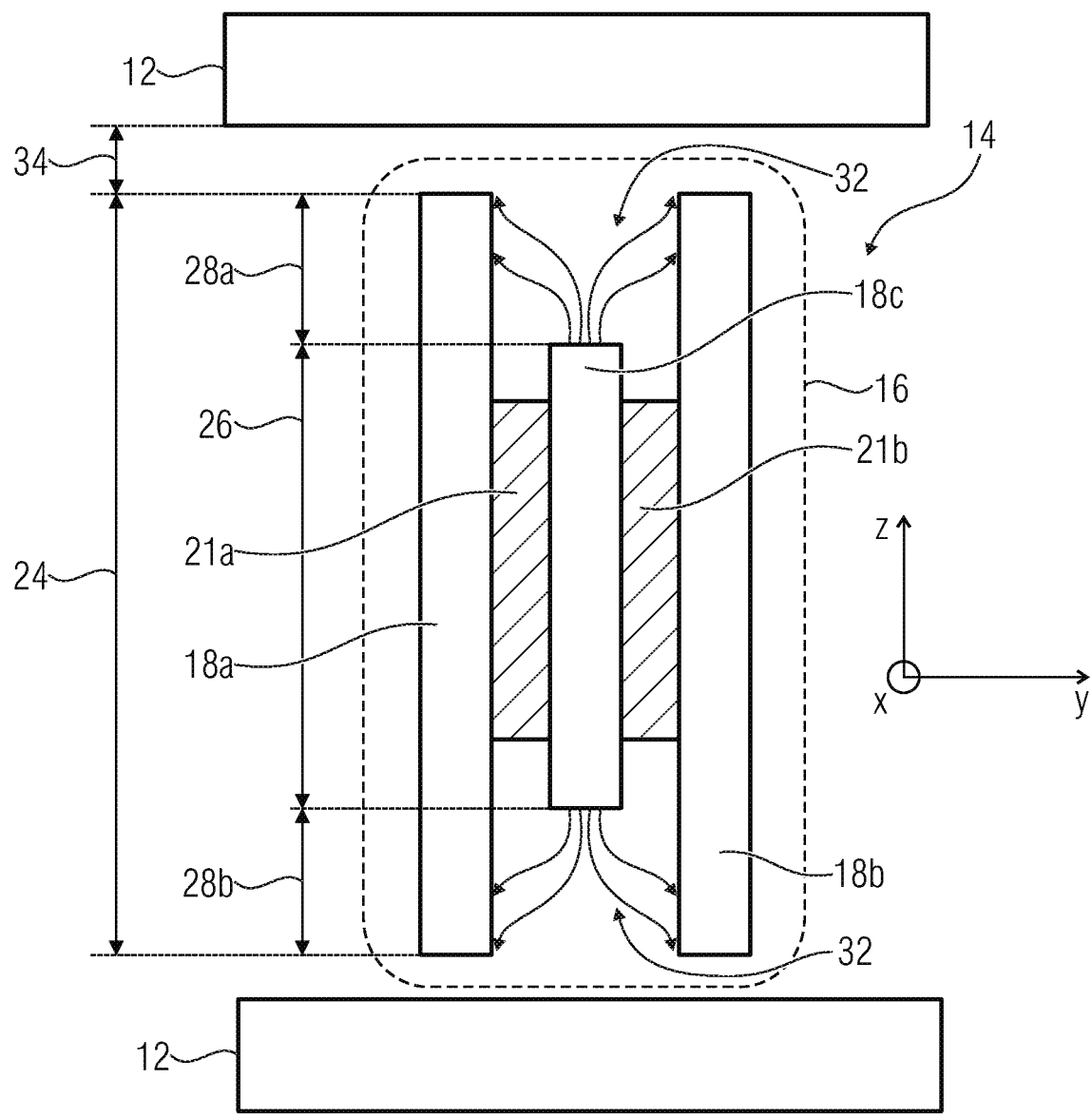
FIG. 1 shows a schematic sectional view of a MEMS according to an embodiment and according to a first aspect.

Before the following embodiments of the present invention are explained in detail based on the drawings, it is to be noted that identical, functionally identical or equivalent elements, objects and/or structures in the different figures are provided with the same reference numerals so that the description of these elements presented in different embodiments is interchangeable or may be applied to each other.

FIG. 1 shows a schematic side-sectional view of a MEMS 10 according to an embodiment and according to a first aspect. The MEMS 10 includes a substrate 12 comprising a cavity 14. The substrate may, for example, be a semiconductor material, such as a silicon material or the like. Alternatively or additionally, it may be a material manufactured from a semiconductor material, such as silicon oxide, silicon nitride or the like. In general, the material may consist of or include a conductive or non-conductive layer. Preferably, a material of the substrate 12 is a material that may be processed and/or manufactured at the wafer-level to enable manufacturing of the MEMS 10 at the wafer-level. In practice, the substrate 12 is provided by thermal bonding of silicon wafers or by the use of a semi-finished product—the so-called BSOI wafers (Bonded Silicon On Insulator Wafers).

The MEMS 10 includes a movable element 16 arranged in the cavity 14. For example, the movable member includes three electrodes 18a, 18b and 18c, the electrode 18c being arranged between the electrodes 18a and 18b, the electrodes being arranged side by side in a substrate plane. The electrodes 18a, 18b and 18c may consist of a doped, conductive semiconductor (e.g. silicon) or of a conductive metal. When applying a voltage difference or an electrical potential between the electrodes 18a and 18c, electrostatic forces may be obtained between the electrodes 18a and 18c, which may lead, for example, to an attraction or repulsion between the electrodes. An attracting force may be obtained, for example, based on a voltage difference. A repulsive force may be obtained by keeping both the electrodes at the same potential and building up a voltage difference with respect to a further (external) potential. Similarly, an electrical voltage between the electrodes 18b and 18c may cause attraction or repulsion between these electrodes. The movable member 16 is configured to perform, in response to an electric potential between the electrodes 18a and 18c and/or in response to an electric potential between the electrodes 18b and 18c, which means, based on the attracting forces or the repulsive forces, a movement along a positive or negative y-direction located in a substrate plane. For this purpose, the electrode 18a is fixed in an electrically insulated manner with respect to the electrode 18c at least at one discrete area 21a. This means that the electrodes 18a and 18b are mechanically connected to each other at least at one discrete area 21a, so that the attracting or repulsive force between the electrodes is converted into a movement along the positive or negative y-direction, as described in detail later. In the same way, the electrodes 18b and 18c are fixed in an electrically insulated manner with respect to each other at least at one discrete area 21b, that is, they are mechanically connected. The areas 21a and 21b cover only a limited area along the x-direction. Along the z-direction, the areas 21a and/or 21b may cover a subarea of electrode 18c or cover the electrode 18c in a planar manner. The discrete areas 21a and 21b may be discrete along a bar length (i.e. in x-direction). The areas 21a and 21b may be at least one spacer that mechanically and electrically separates all three electrodes 18a to 18c from each other. However, it is also possible that the areas 21a and/or 21b along the z-direction are implemented at the same height as the first electrode 18a and the second electrode 18b, e.g. when a recess of the middle electrode is implemented.

The electrode 18c arranged between the parallel electrodes 18a and 18b with main sides perpendicular to the substrate plane comprises a smaller dimension along a z-direction than the electrodes 18a and 18b along the z-direction. The z-direction may also be referred to as the thickness direction, wherein the substrate plane is spanned by the y-direction and a third spatial coordinate perpendicular to the y-direction and the z-direction. A dimension 24 of the electrodes 18a and 18b along the z-direction therefore comprises a greater value than a dimension 26 of the electrode 18c. Preferably, the electrodes 18a and 18b comprise an overhang 28a and 28b, respectively, along the positive and negative z-directions starting from electrode 18c, i.e. they overhang the electrode 18c along the positive z-direction and negative z-direction. This allows an electric field, represented by field lines 32 of the electrode 18c, to be shielded from the electrodes 18a and 18b, for example with respect to the substrate 12.

Although the electrodes 18a and 18b are illustrated to comprise the same dimension 24 along the z-direction, the electrodes 18a and 18b may also be implemented with different dimensions 24 along the z-direction. Although the electrodes 18a and 18b are illustrated to comprise the same position along the z-direction, the electrodes 18a and 18b may also be offset from each other along the z-direction.

According to an embodiment, the dimension 26 of the electrodes 18c is at least 2% smaller, at least 10% smaller, at least 15% smaller or at least 20% smaller compared to the dimension 24 of the electrodes 18a and 18b. This means that a sum of the overhangs 28a and 28b is at least 2%, at least 10%, at least 15% or at least 20% of the dimension 24. The dimension 26 may be set based on different implementation criteria with respect to the dimension 24. For example, a reduced dimension 26 may result in lower attractive or repulsive forces between the electrodes, which may result in a lower deflection amplitude or deflection force of the movable element 16. At the same time, however, reduced field effects compared to substrate 12 may be obtained and, on the contrary, due to an increased dimension 26, stronger forces between the electrodes may be obtained while reducing the shielding of the electric field. The overhangs or recesses 28a and/or 28b of the middle electrode 18c may comprise any value. They preferably have an expansion along the z-direction which is at least the distance (gap width) between the electrode 18c and the adjacent electrode 18a and/or 18b along the y-direction. Especially preferred are recesses which are a multiple of the distance along the y-direction, at least by a factor of 2, at least by a factor of 3, or at least by a factor of 5 greater than the distance. An increasing recess enables an increasing shielding of the middle electrode 18c against the substrate 12.

To maintain the shielding effect, it may be advantageous to apply a reference potential to the electrodes 18a and 18b and the substrate 12 while applying a different electrical potential to the electrode 18c. However, it is also possible to apply the reference potential only to the electrodes 18a and 18b, while applying a different electrical potential to the electrode 18c and substrate 12.

The reduced dimension 26 of the electrode 18c compared to the dimension 24 enables a shielding of the electric field against surrounding structures, such as the substrate 12. This enables a small distance between the movable element 16 and the substrate 12. A distance 34 between the movable element 16 and the substrate 12 along the z-direction may influence a flow loss of the MEMS 10. Due to the shielding of the electric field, the distance 34 may be a value of not more than 1 µm, not more than 0.5 µm, not more than 0.25 µm or even not more than 0.1 µm.

In other words, in order to reduce the electric field between the electrode 18c, which is applied with a potential different from the reference potential, and the surrounding substrate, and to avoid or reduce the vertical pull-in effect, the middle electrode 18c of the LNED actuator is provided with a recess at the top and bottom, respectively, i.e. along the positive z-direction and negative z-direction. The term recess here refers to the possibility of structuring the electrode 18c in such a way that both the upper and lower sides of the electrode 18c are shorter than those of the electrodes 18a and 18b. In this way, the electrode 18c is partially to strongly electrically shielded from the substrate 12 by the outer electrodes 18a and 18b. If less or no electric field lines are formed from the electrode 18c to the substrate, then there is little or no electric force between the electrode 18c and the surrounding substrate 12. In this case, the pull-in effect only occurs at much higher voltages compared to the case where the electrode 18c comprises no recess, i.e. no overhang is provided by the outer electrodes. The vertical pull-in voltage may therefore be greater than the normal control voltage of the actuators, so that no vertical pull-in effect occurs during regular operation of the MEMS 10.

Figure 2A:
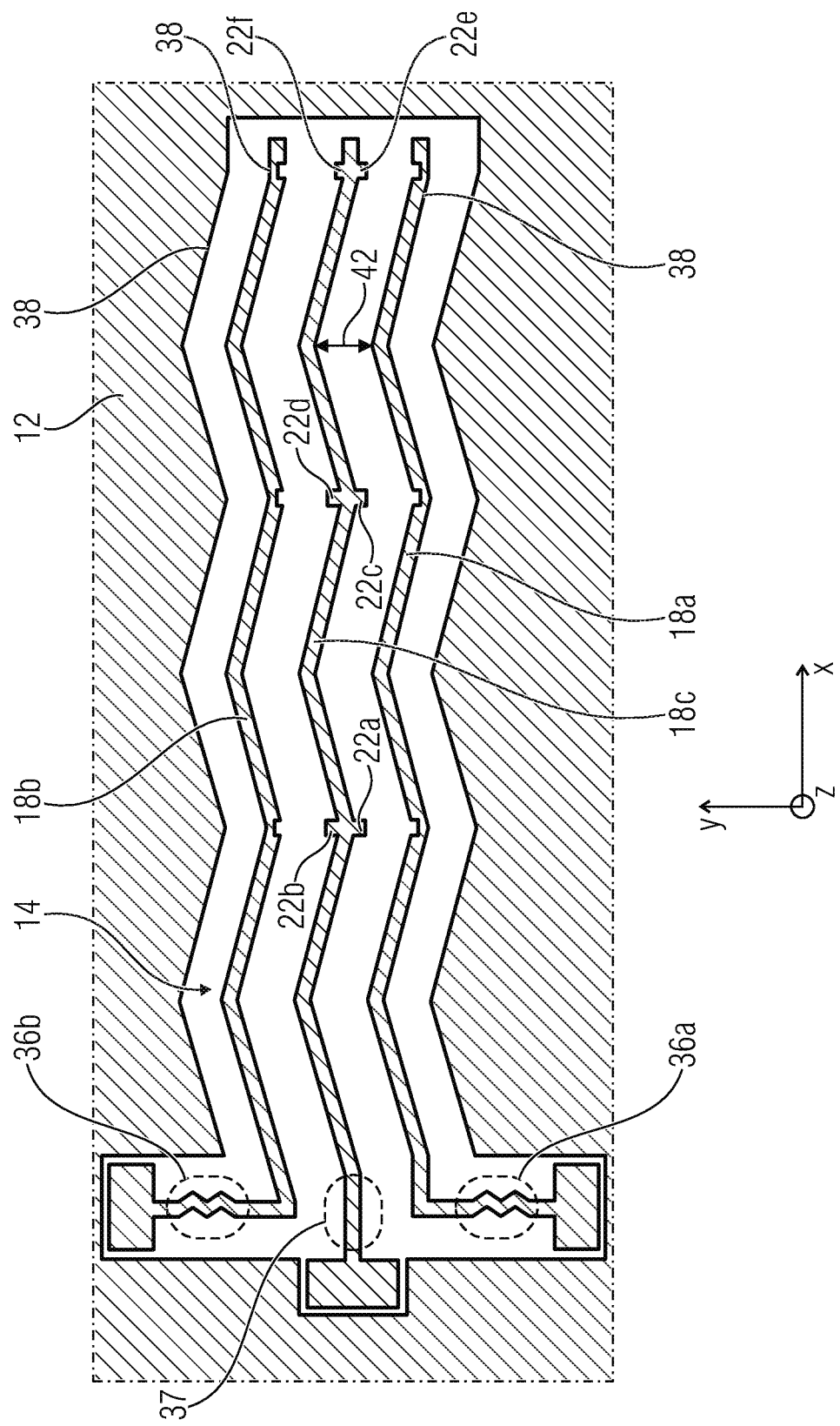
FIG. 2a shows a schematic top view or longitudinal section of a MEMS according to an example of the second aspect before fixing the electrodes with each other.

FIG. 2a shows a schematic view of a longitudinal section of a MEMS 20, the longitudinal section being parallel to the substrate plane, i.e. the x/y-plane. FIG. 2a shows the MEMS 20 in a state before fixation between the electrodes 18a and 18b, respectively, with electrode 18c has occurred or after this fixation has been released. Between the electrodes 18a and 18c and/or between the electrodes 18b and 18c a gap 42 may be arranged which is influenced, for example, by process parameters or the possibility of the process. For example, the gap 42, or a dimension of the gap 42, may be a result of the aspect ratio used between the expansion along the z-direction and a gap 42 resulting therefrom. Manufacturing the gap 42 may be done, for example, by trench etching or deep reactive ion etching (DRIE), wherein the aspect ratio that may be safely achieved technologically is currently 25 to 30. This ratio may be further increased in the future. For the function of the LNED actuator 14 encapsulated by the substrate 12 and for the prevention of vertical pull-in, however, an aspect ratio of 400 to 10,000 makes sense—which, however, cannot be achieved with conventional technology today. For example, with an aspect ratio of a trench depth to a trench width of 25-30 and an expansion of the electrodes 18a and 18b along the z-direction of 700 µm, the dimension of the gap 42 may be approximately 10 µm to 30 µm. For example, with an aspect ratio of 25-30 and an expansion of the electrodes 18a and 18b along the z-direction of 400 µm, the dimension of the gap 42 may be approximately 13 µm to 16 µm. Embodiments may comprise different aspect ratios with a value of at least 50, of at least 100, of at least 400, or even higher. At the same time, the aspect ratio of at least 50 may comprise an upper limit of 10,000 or more, the aspect ratio of at least 100 may comprise an upper limit of 7,000 or more and/or the aspect ratio of at least 400 may comprise an upper limit of 3,500 or more.

The middle electrode 18c comprises projections in discrete areas 22a to 22f, while the electrodes 18a and 18b, which run essentially parallel to the electrode 18c, also comprise attachment areas at corresponding points or areas, for example in the form of a groove. The projections may be implemented as areas 21 according to FIG. 1, or may include any other preferred electrically insulating material. This means that by joining the discrete areas 22a to 22f with corresponding areas of the electrodes 18a and 18b, a fixation of the electrode 18a with the electrode 18c and a fixation of the electrode 18b with the electrode 18c may take place. For example, FIG. 2a shows a state after the structures of the electrodes 18a to 18c have been formed from the substrate 12, for example, by an etching process. A deep reactive ion etching (DRIE) process, for example in silicon wafer substrates, is suitable for this purpose. The electrodes 18a to 18c may be formed in the cavity 14 of the substrate 12 in such a way that the electrode 18a and the electrode 18b are connected to the substrate 12 via spring elements 36a and 36b, respectively. The electrode 18c may be connected to the substrate 12 via a spring element 37 that allows the electrode 18c to be deflected along the movement direction y. In other words, the electrodes 18a, 18b and 18c are connected to or suspended from the substrate 12, wherein the spring element 36a may be arranged between the substrate 12 and the electrode 18a, while the spring element 36b may be arranged between the substrate 12 and the electrode 18b.

An electrically non-conductive or electrically insulating layer 38, for example including silicon nitride ($Si_3N_4$), silicon dioxide ($SiO_2$), aluminum oxide ($Al_2O_3$) and/or aluminum nitride (AlN), may be arranged on side walls of the substrate 12 and/or on side walls of the electrodes 18a to 18c, at least in the area of the fixations 22a to 22f but also generally on all surfaces, in order to prevent an electrical contact or an electrical short circuit between the electrodes.

Figure 2B:
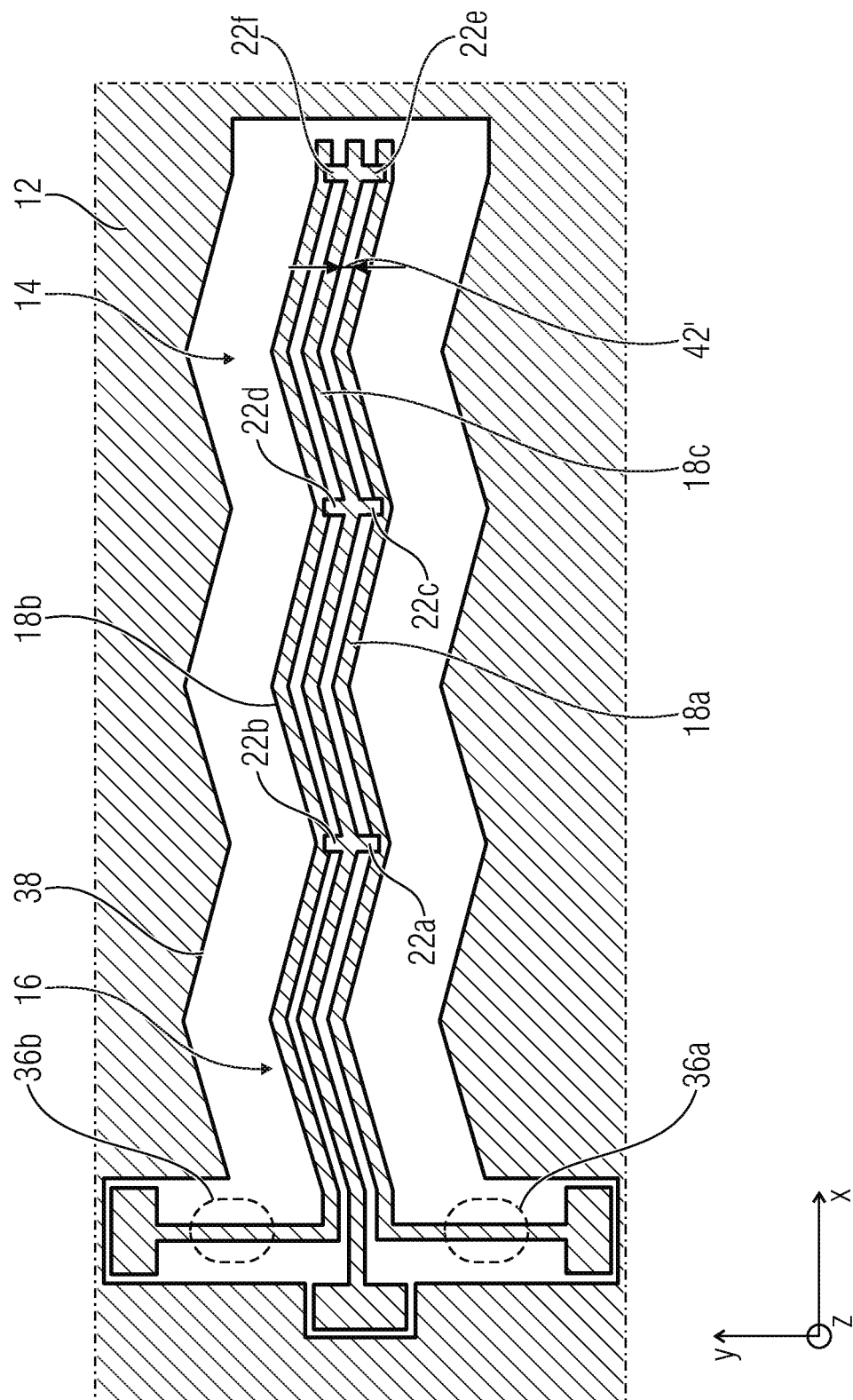
FIG. 2b shows the MEMS of FIG. 2a in a state in which the electrodes are fixed with respect to each other at discrete areas.

FIG. 2b shows the MEMS 20 in a state where the electrode 18a is fixed with respect to the electrode 18c and the electrode 18b is fixed with respect to the electrode 18c in the discrete areas 22a to 22f. Due to the approximation of the electrodes, the gap 42 may be reduced to a gap 42', which, e.g., is less than 5 µm, less than 3 µm or at most 1 µm. Smaller dimensions are also possible, for example a maximum of 0.8 µm or a maximum of 0.2 µm.

The movable element 16 including the electrodes 18a, 18b and 18c is configured to perform an movement along the y-direction in the x/y-plane in response to an electric potential between the electrode 18a and the electrode 18c and/or between the electrode 18b and the electrode 18c. For this purpose, the movable element may have one of a plurality of geometries. For example, the movable element 16, or the electrodes 18a to 18c, may have a multiple buckled progression along the x-direction. Alternatively or additionally, the electrodes 18a to 18c, for example, may extend essentially parallel to each other, for example, in a dome-shaped buckled progression. Other configurations are also possible. By fixation in the discrete areas 22a to 22f, for example, an attractive force between the electrodes 18b and 18c or a repulsive force between the electrodes 18a and 18c causes a movement of the deformable element 16 along the negative y-direction. A repulsive force between the electrodes 18b and 18c and/or an attractive force between the electrodes 18c and 18c, on the other hand, may cause a movement of the movable element 16 along the positive y-direction. Other geometries may also be implemented, i.e. the electrodes 18a, 18b and/or 18c may comprise a different progression or shape. Alternatively or additionally a different arrangement and/or a different number of discrete areas 22a to 22f may be used to fix the electrodes with respect to each other. For example, FIG. 2b illustrates that the projections of the electrode 18c rise essentially in parallel to the y-direction of the electrode 18c. According to alternative embodiments, at least one discrete area 22a to 22f may be arranged at an angle to the y-direction. According to alternative or additional embodiments, a projection may also be arranged on an electrode 18a or 18b, while a corresponding fitting piece, which may also be formed as a tongue or groove, is arranged on the electrode 18c. The fitting piece may, for example, have the shape of a dovetail or another toothing geometry.

In other words, the electrodes 18a and 18b are moved in the direction of the electrode 18c when FIG. 2a is used as comparison. As a result, the spring elements 36a and 36b are at least partially tensioned, i.e. there is a tensile stress, so that when the fixation is released in the discrete areas 22a to 22f, i.e. when the fixation is separated, the electrodes 18a and 18b move away from the electrode 18c, for example by the spring elements 36a and 36b relaxing and/or contracting and at least partially assuming the arrangement from FIG. 2a. The separation of the fixation may be a theoretical operating state which is not intended for the actual operation of the MEMS.

The mechanical stress leading to the removal of the electrodes 18a and 18b from the electrode 18c may be provided by the spring elements 36a and 36b.

For example, connecting the electrodes 18a and 18b to the electrode 18c may take place by generating electrical attraction forces, e.g., by applying a control potential to the electrode 18c and a reference potential to the electrodes 18a and 18b. Due to the resulting attraction forces, the electrodes 18a and 18c, and 18b and 18c, respectively, may be brought into mechanical contact with each other, wherein electrical insulation of the electrodes from each other may be provided by the insulation layer 38. In order to generate an effective, possibly final or irreversible mechanical connection of the electrodes, one or several mechanisms of action may be used. A fixation between the electrode 18a and the electrode 18c and/or between the electrode 18b and the electrode 18c at the discrete areas 22a to 22f may be obtained by mechanical latching with the use of mechanical latching geometries such as tongue and groove connections, dovetail connections or the like. Alternatively or additionally, electrostatic sticking may be used, a fixation by subsequent deposition of a thin layer and/or a fixed connection by surface forces such as Van-der-Waals forces may be obtained. The fixation by subsequent deposition of thin layers may, for example, take place in such a way that the electrodes are first brought closer to each other, e.g., by electrostatic sticking or another process described herein, and in this state a layer is deposited that introduces forces into the system that hold the electrodes together. Alternatively or additionally, the electrodes may be held together by charging the insulation layer 38. For example, the insulation layer 38 may be electrically charged due to manufacturing and act as an additional voltage source holding the electrodes together. Thus an electrostatic attraction may be used. Alternatively or additionally, a subsequent protection may be used to maintain the mechanical connection between the electrodes through thermal activation, e.g., of the insulation layer 38. During activation, a force may be obtained at interfaces between two material surfaces, e.g. between one surface of the insulation layer 38 and an adjacent layer. For example, the insulation layer 38 may consist of so-called thermal $SiO_2$ or comprise the same and may be thermally activated after the mechanical interconnection, so that the insulation layer 38 provides the fixation. Alternatively or additionally, a chemical compound, such as an adhesive bond, may also be used, e.g., by using a polymer that is cured. It is also possible to introduce a liquid that evaporates or volatilizes after assembly. By such a drying process, surface forces between the electrodes may be obtained, which also provide a fixation.

In other words, the electrodes may be brought closer by applying an electrical voltage between the electrodes 18a and 18c and/or between the electrodes 18a and 18c and the associated attraction forces. The electrodes are brought close to such an extent that they come into mechanical contact in the area of the fixations 22a to 22f and remain temporarily or permanently attached due to surface forces. Alternatively or additionally, an approximation is possible by applying suitable electrical charges which remain on the electrodes. Alternatively or additionally, the approximation may also be achieved by introducing a suitable liquid into the gap 42, then evaporating it by drying and moving the electrodes 18a and 18c and/or 18b and 18c towards each other as a result of the surface forces acting until they come into mechanical contact in the area of the fixations 22a to 22f and remain temporarily or permanently adhered due to surface forces. In case the previously described approximation of the electrodes and the mechanical contact only occur temporarily— i.e. for a certain time only—the electrodes 18a, 18b and 18c of the MEMS 20 shown in FIG. 2b may be permanently fixed with one another by deposition of a further, suitable thin layer. The thin layer may include an electrically insulating material such as silicon nitride ($Si_3N_4$), silicon dioxide ($SiO_2$) and/or aluminum oxide ($Al_2O_3$) and/or aluminum nitride (AlN).

The reduced distance between the electrodes compared to FIG. 2a enables the generation of high electrostatic forces between the electrodes. Furthermore, the implementation of the electrodes according to the illustration in FIG. 2a enables existing limitations of the processes used to shape the electrodes 18a, 18b and 18c to have no or only a minor restrictive effect on the expansion of the electrodes and thus of the MEMS 20 along the z-direction. This enables a great expansion of the MEMS 20 along the thickness direction z, so that a vertical pull-in effect, i.e. along the z-direction, may be reduced or avoided by the great expansion and the resulting high stability of the electrodes. A lateral dimension of the MEMS 20 or the electrodes 18a and 18b perpendicular to the movement direction x, i.e. along the thickness direction z, may be greater than 150 μm, greater than 400 μm, greater than 600 μm, or at least 700 μm.

In other words, a general condition may be specified according to which a device layer of 700 μm is to be manufactured, i.e. wherein the dimensions of the electrodes 18a and 18b, and possibly also of the electrode 18c along the z-direction, are at least 700 μm. Furthermore, DRIE may still be used for etching the NED gap, i.e. a currently technologically feasible aspect ratio of 25 to 30 is still to be used for deep etching. For example, this may be achieved by etching the LNED gap with a width of approx. 25 μm and a depth of approx. 700 μm and subsequently reducing it to 1 μm or less in an electrical test phase of the device, i.e. between the FIGS. 2a and 2b. In other words, the gap is provided, subsequently reduced by bringing together the electrodes, and the electrodes are firmly connected to each other.

Such a thick device layer of at least 400 μm, at least 600 μm, or at least 700 μm is advantageous. By the subsequent approximation of the electrode layers, technological restrictions may be overcome which, based on the aspect ratios, may hinder such an implementation. For example, the distance to be maintained between the electrodes, which is difficult or impossible to achieve with the usual aspect ratios and the mentioned thicknesses, may be a limiting factor. However, the efficiency of the actuator may at least be affected by the distance between the electrodes, also known as LNED gap or electrode spacing. The smaller the gap, the greater the electrostatic forces of the actuator may be; the more efficient the LNED actuator may be with respect to large bending moments and large deflections; the smaller the control voltages that may be used; the larger the achievable sound pressure levels when the LNED actuator is used as a loudspeaker; and/or the smaller the chip area that may be needed to generate a comparable sound power pressure, which may have a beneficial effect on a device price. The LNED gap may be manufactured using DRIE etching. Because DRIE is highly dependent on the trench aspect ratio (aspect ratio from trench depth to trench width), and because aspect ratios of more than 30 may cause problems with etch stability, such an aspect ratio may be used to manufacture embodiments described herein, for example by manufacturing a device layer of 75 μm and forming a gap of 3 μm or less in width, resulting in an aspect ratio for DRIE etching of 25, which may be arbitrarily adjusted. The described approach may also be used to obtain actuators with a layer thickness of 700 μm (or more), wherein the NED gap is only 200 nm (or less). This may result in a subsequent aspect ratio of 3,500 or more, which is difficult or impossible to achieve with DRIE etching. Embodiments may provide different aspect ratios with a value of up to 3,500, up to 7,000, or even up to 10,000.

According to the first aspect, the pull-in effect is thus reduced or prevented by making the electrode 18c smaller along the z-direction than the surrounding electrodes 18a and 18b. According to the second aspect, increased stability to reduce or avoid the vertical pull-in effect is also obtained by obtaining a large dimension along the z-direction. The first aspect and the second aspect as well as the advantageous embodiments described in their context may be provided independently of each other, but may also be combined with each other as desired, which means that the MEMS 20 may also be implemented with electrodes of different sizes in accordance with the implementations in connection with the MEMS 10. Alternatively or additionally, a dimension of the electrodes 18a and 18b of the MEMS 10 in FIG. 1 may be 400 μm or more. For this purpose, the electrode 18a may be connected to the substrate 12 via a spring element under tensile stress, such as the spring element 36a. Alternatively or additionally, the electrode 18b may be connected to the substrate 12 via a spring element under tensile stress, i.e. that is tensioned, such as the spring element 36b. It is also possible to realize the implementations according to the first aspect and the implementations according to the second aspect independently of each other in the absence of the other aspect.

Figure 2C:
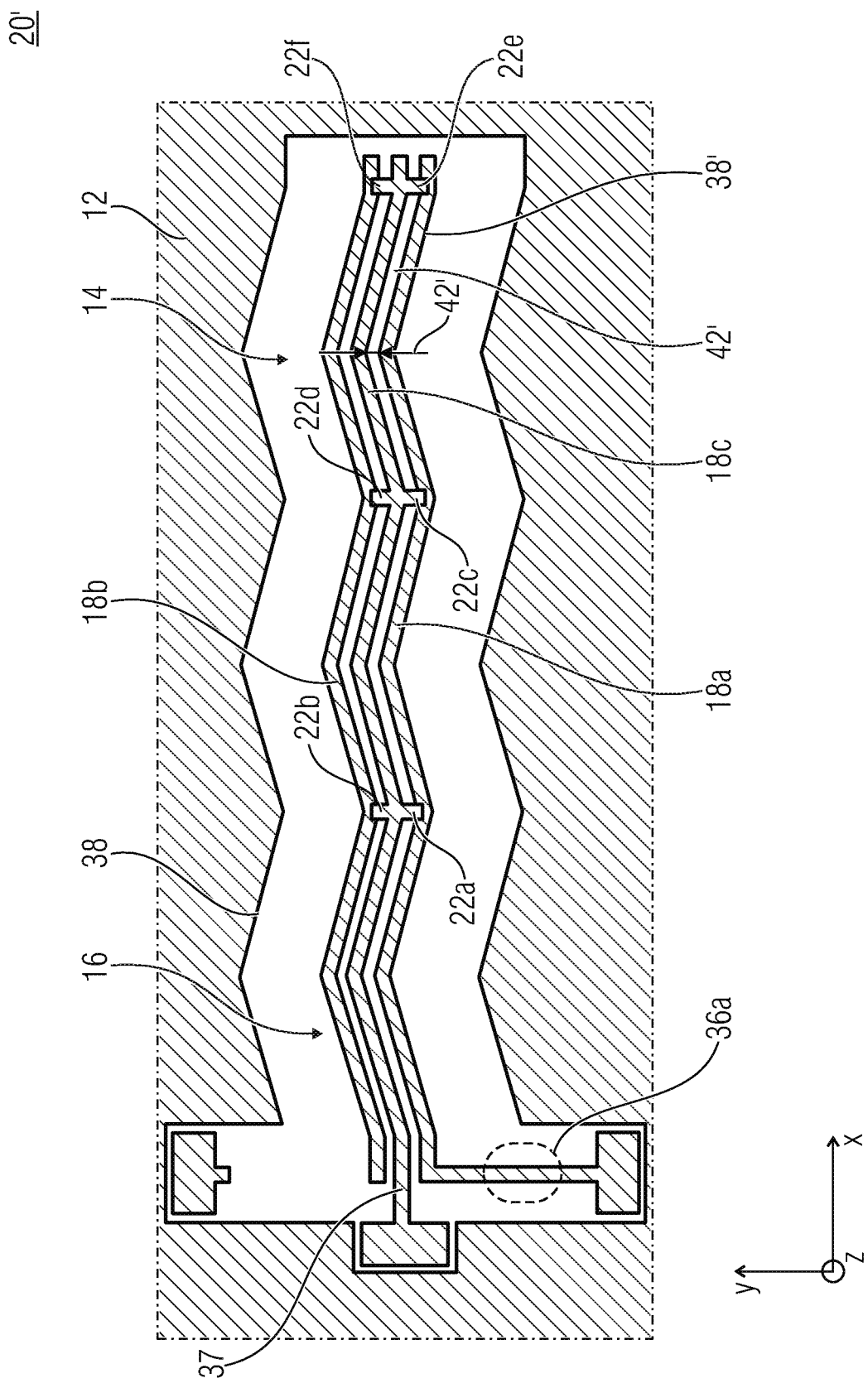
FIG. 2c shows a schematic top view of a MEMS modified compared to FIG. 2b according to an embodiment in which a spring element is removed.

FIG. 2c shows a schematic top view of a modified MEMS 20' having the spring element 36a removed in comparison to the MEMS 20. Alternatively or additionally, one of the spring elements 36b or 37 may also be removed, at least one of the spring elements being retained in order to support the movable element with respect to the substrate 12. Removing one or several of the spring elements 36a and/or 36b and/or 37 may be carried out after obtaining the fixation, e.g. when a MEMS having a low natural frequency is to be manufactured, e.g. for loudspeakers designed to emit low frequency audible sound. This means that although the MEMS 20 is described as a product to be manufactured, it may be further processed and then be considered as an intermediate product. Despite removing spring elements, the aspect ratio of the MEMS and/or the attachment of the electrodes to each other remains. It is understood that when the spring element 36a, 36b or 37 is intentionally removed, the same may be formed as a deflectable spring, but this is not required, especially with regard to the spring element 37. This means that a structure to be removed may be formed as a sacrificial structure which remains unmoved during fixation (spring 37), may be deflected or, if needed, may break. Damage may be negligible in view of the subsequent removal.

The MEMS 20' may be described as a MEMS including the substrate 12 comprising the cavity 14. The movable element 16 arranged in the cavity 14 includes the first electrode 18a, the second electrode 18b and the third electrode 18c arranged between the first electrode 18a and the second electrode 18b, the third electrode being fixed in an electrically insulated manner with the first electrode 18a and the second electrode 18b with a fixation at the discrete areas 22a-f. The movable member 16 is configured to perform a movement along the movement direction y in the substrate plane x/y in response to an electric potential between the first electrode 18a and the third electrode 18c and/or in response to an electric potential between the second electrode 18b and the third electrode 18c. In this respect, the MEMS 20' may be formed in the same way as the MEMS 20. The first electrode 18a and the second electrode 18b may be separated from the third electrode 18c at the discrete areas by a functional layer 38' and may be connected to each other in a mechanically fixed manner. The functional layer 38' may comprise at least one material layer—such as a thin layer deposited in conformity—and provides the function of an electrical insulation of the electrodes 18a and 18c and 18b and 18c against each other. In addition, the functional layer 38' provides the function of the mechanical connection or adhesion. At least one of the electrodes 18a, 18b and/or 18c is connected to the substrate 12 via a spring element, as shown for the spring elements 36b and 37. At least one of the electrodes 18a, 18b and/or 18c is only indirectly connected to the substrate 12 via an adjacent electrode. This means, for example, that the electrode 18a is connected in a mechanically fixed manner to the electrode 18c at the discrete areas 22b, 22d and 22f and is supported with respect to the substrate 12 by the same.

The electrode 18a, 18b and/or 18c that is supported only indirectly with respect to the substrate may be separated from the spring element after fixing this electrode to another electrode that is supported directly or indirectly with respect to the substrate.

Alternatively, one or several other spring elements may be removed. Preferably, symmetry is obtained, e.g., by removing a middle spring, such as the spring 37, and retaining the outer spring or vice versa.

The spring elements 36a, 36b and 37 of the MEMS 37 also serve as an electrical path to the electrodes 18a, 18b and 18c. If such a spring is removed, a path may be obtained via a remaining spring, possibly electrically insulated from a traversed electrode. For example, a path that is electrically insulated from the electrode 18c may be led from the substrate 12 via the electrode 18c to the electrode 18a. Alternatively, wireless energy transmission or a sliding contact between substrate and electrode 18a may be implemented. An electrical contact of the electrodes 18a, 18b and/or 18c with a metal path along 18c and insulated from below from 18c may be led, e.g., over the discrete areas 22b, 22d and/or 22f. The metallization or deposition and structuring may take place after bringing together the electrodes 18a-c, but it is also possible to arrange the metallization at any other time.

Without limitation, this embodiment, like other embodiments, allows an aspect ratio of a distance between the first electrode 18a and/or the second electrode 18b with respect to the third electrode 18c and a dimension of the first electrode 18a along a direction z perpendicular to the movement direction y to be greater than 100. The aspect of removing one or several spring elements may be combined with any other implementation described herein.

Figure 2D:
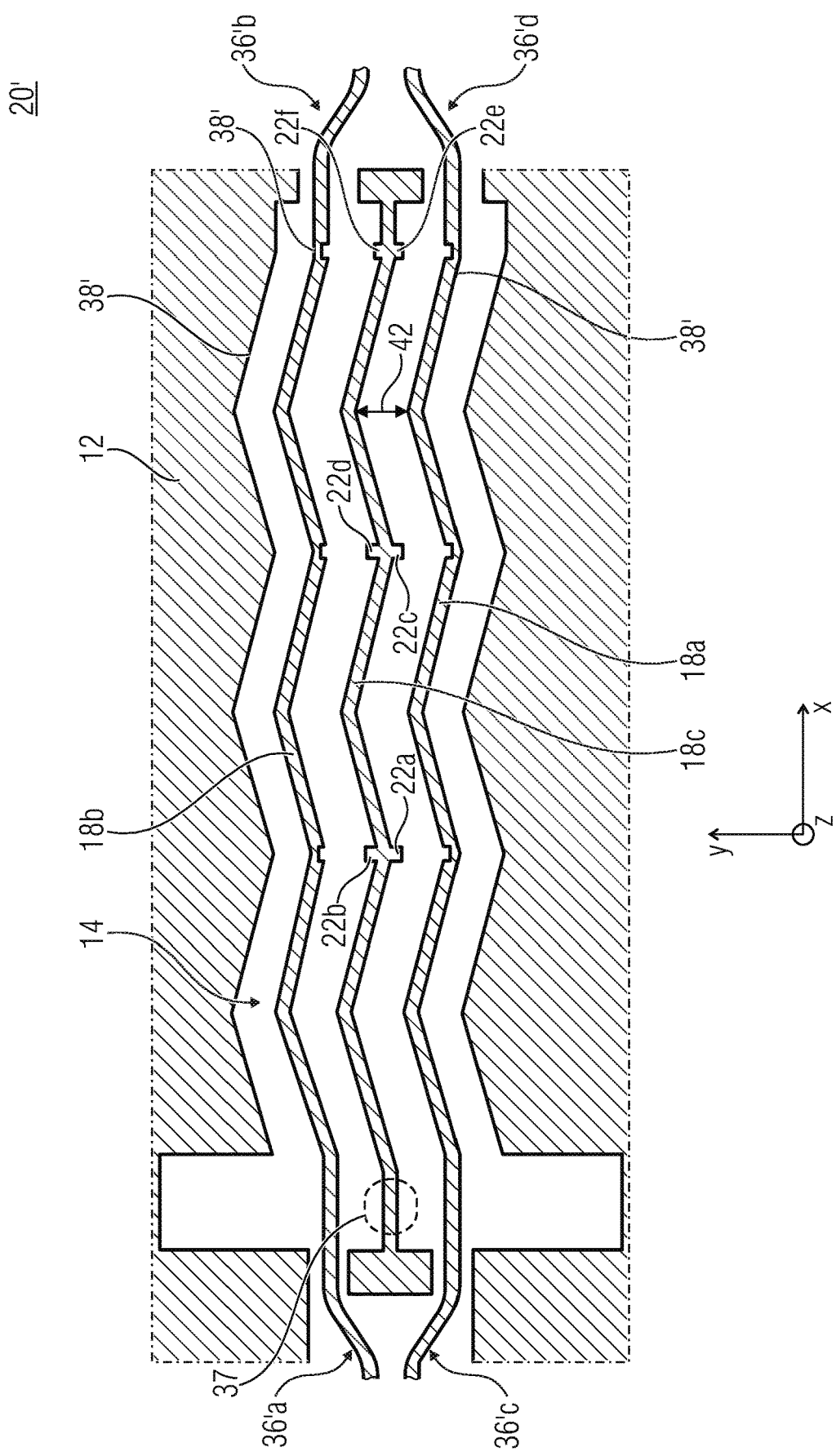
FIG. 2d shows a schematic top view or longitudinal section of a MEMS according to an embodiment of the second aspect comprising bistable springs.

FIG. 2d shows a schematic view of a longitudinal section of a MEMS 20", wherein the longitudinal section is parallel to the substrate plane. Compared to the MEMS 20 from FIG. 2a, the MEMS 20" may comprise spring elements 36'a to 36'd, e.g., which are formed as bending springs or bending beams. One spring element 36'a to 36'd each may be arranged at a distal end and a proximal end of the electrode 18a and the electrode 18b, respectively, wherein the proximal end may be arranged, e.g., adjacent to a clamping of the electrode 18c. It is understood that these relative positional concepts may be arbitrarily interchanged with each other without restriction, not restricting the teachings explained in connection with the embodiments described herein. As an alternative to an arrangement of the spring elements at distal and proximal ends, an arrangement in each cell of a plurality or multitude of cells of the MEMS 20" that is formed as a beam may also be carried out. A cell describes a bar portion between the two points or areas 22a-22c where the electrodes come into mechanical contact.

Figure 2E:
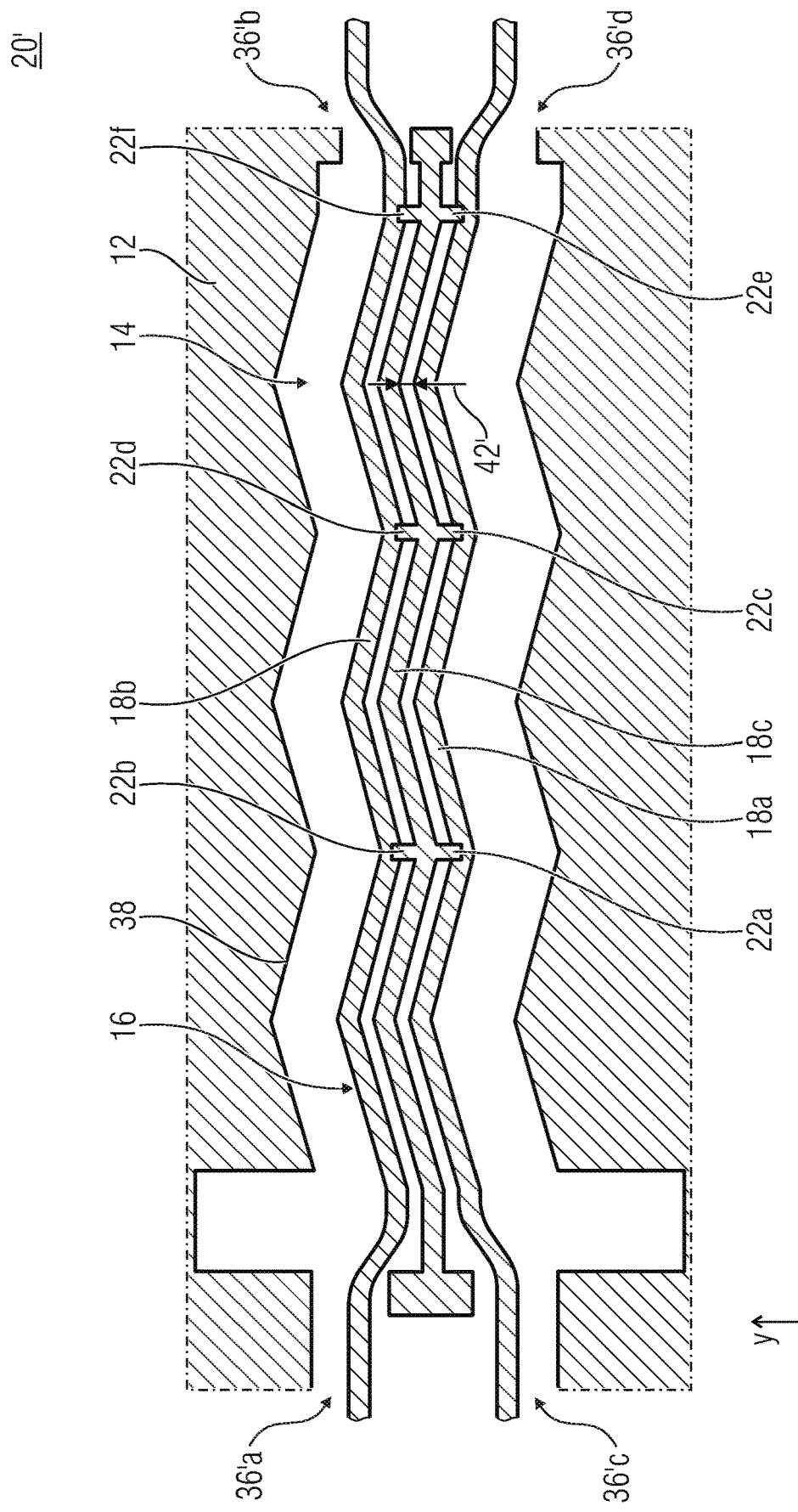
FIG. 2e shows the MEMS of FIG. 2d in a state in which the electrodes are fixed with respect to each other at discrete areas.

FIG. 2e shows a schematic view of the longitudinal section of the MEMS 20", in which the electrodes 18a to 18c are close to each other. For approaching and/or maintaining the fixation, the same or at least comparable steps may be performed as explained in connection with FIG. 2a and FIG. 2b. For example, the spring elements 36'a to 36'd may be configured as a bistable spring in order to keep the forces to a minimum that pull or push the electrodes 18a to 18c apart. A different shape is also possible, e.g. monostable springs or al springs that have a higher number of stable states. In contrast to the MEMS 20, wherein the spring elements 36a and 36b are described as being under tensile stress, the MEMS 20" may be modified so that the spring elements 36'a to 36'd are under mechanical stress that is obtained by beam-bending the spring elements 36'a and 36'b. This may also be understood to mean that, alternatively or additionally to the springs under tension, a multi-stable structure holding or positioning the electrode 18a and/or 18b relative to the electrode 18c may be arranged.

As is described in connection with the MEMS 20', at least one of the springs 36'a-d or 37 may be removed.

In other words, bringing together and subsequently fixing the electrodes may also be performed using bistable springs. Mechanically bistable geometries exist also in the MEMS range, which may assume a second deflected state when activated, e.g. by a movement through electrostatic fields, which remains so after removing the activation force, e.g. after removing the electrostatic field. Such an effect may also be described as clicker effect or is known in the area of hair clips. The springs 36'a to 36'd may be arranged in the x-direction and their geometry, e.g. manufactured in an S-shaped curved design, may be such that after bringing together the electrodes they remain in a second stable position, e.g. in a mirrored S-position, thus permanently reducing the gap distance 42. For this purpose, the spring elements 36'a and 36'b or 36'c and 36'd, respectively, may be arranged on both sides of the beam to obtain a beam that is clamped on both sides.

FIG. 2f shows a schematic view of a spring suspension that may be used for the MEMS 20, 20' and/or 20". The three electrodes 18a to 18c are spaced by DRIE-etched trenches and are shown in a state before bringing together the electrodes. Both springs, which are represented as wavy structures, may be bent during bringing together the electrodes and may also change their length slightly. This allows both tensile and compressive stresses to be applied to the bent springs. In FIG. 2f, dark areas represent a material, such as silicon, while lighter areas represent trench structures. An area 39a and/or an area 39b and/or an area 39c may be used as a contact surface for contacting the MEMS, e.g., for contacting the electrodes 18a to 18c. Due to their bent structure, the electrodes 18a and 18b may themselves be used as springs, which flexibly yield when applying the electrical voltage when the electrodes 18a to 18c are brought close to each other. The electrode 18c may be relatively rigid or immobile, i.e. formed in a fixed manner, which means that the electrodes 18a and 18b may move towards the electrode 18c.

Figure 3A:
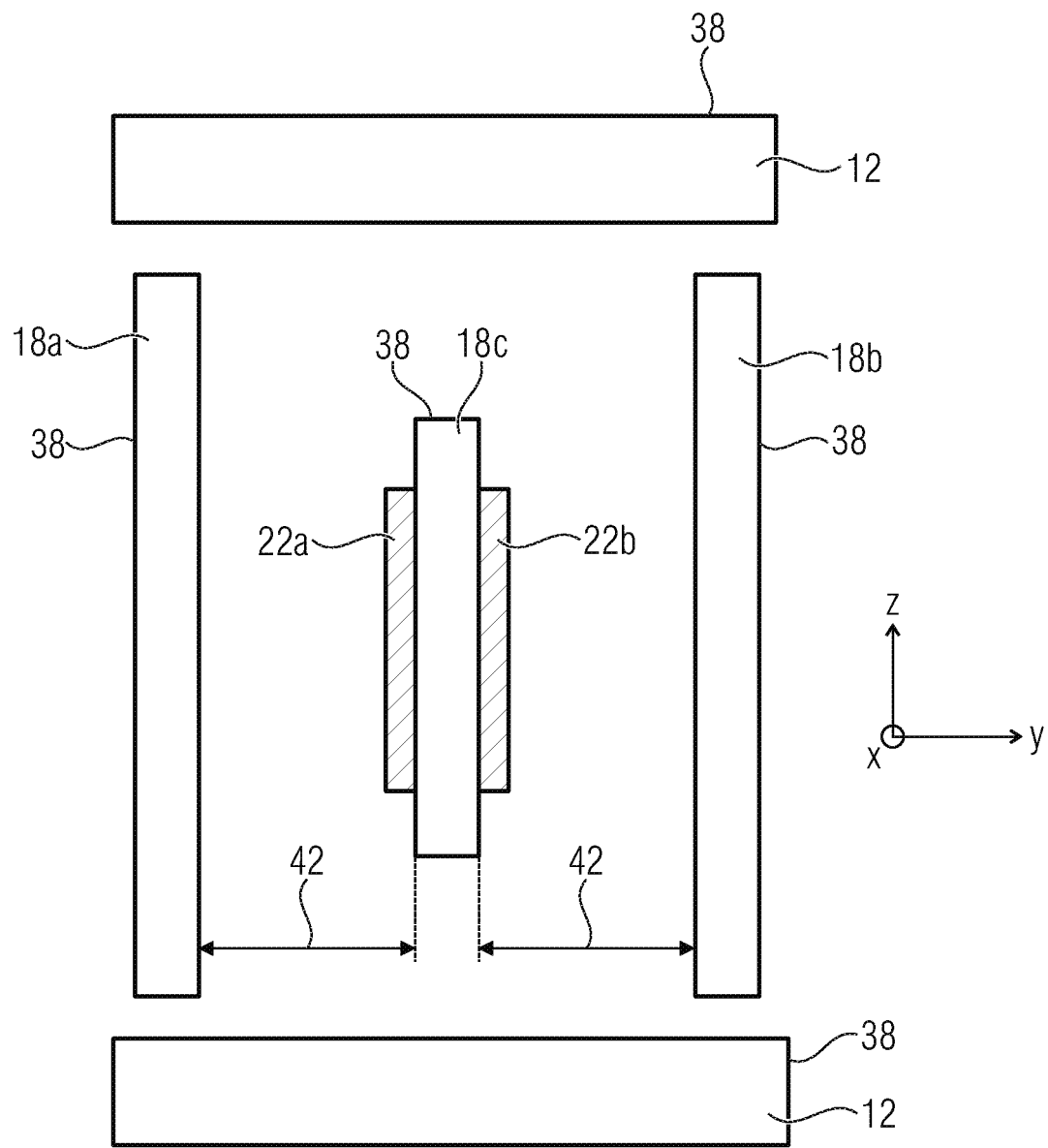
FIG. 3a shows a schematic cross-sectional view of a MEMS comprising features of the first and second aspects according to an embodiment.

FIG. 3a shows a schematic cross-sectional view of a MEMS 30 comprising the electrodes 18a, 18b and 18c extending differently along the z-direction, as described in relation to the MEMS 10, and comprising a state as described for the MEMS 20 in relation to the FIG. 2a. This means that the gap 42 is arranged between the electrode 18a and the electrode 18c. Furthermore, the gap 42 is arranged between the electrode 18b and the electrode 18c.

Figure 3B:
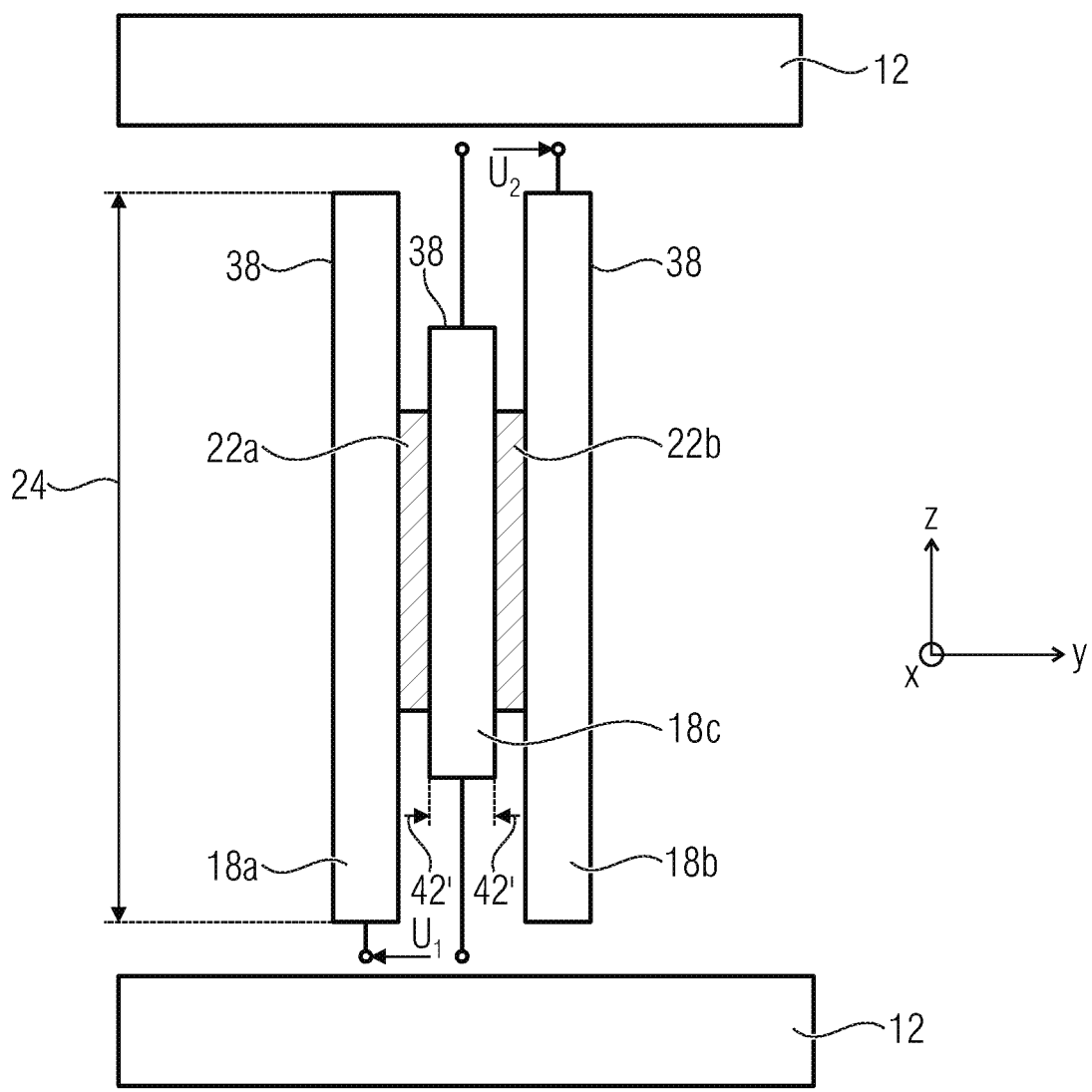
FIG. 3b shows a schematic cross-sectional view of the MEMS from FIG. 3a during or after the fixation of the electrodes at the discrete areas.

FIG. 3b shows a schematic cross-sectional view of the MEMS 30 during or after fixation of the electrodes 18a, 18b and 18c to the discrete areas 22a and 22b. For example, the electrode 18c is charged with a potential with respect to the electrodes 18a and 18b, so that a voltage $U_1$ is present between the electrodes 18a and 18c and so that a potential $U_2$ is present between the electrode 18c and the electrode 18b. The potentials $U_1$ and $U_2$ may have the same value. For example, a voltage applied to electrode 18c may be greater than a control voltage. For example, the MEMS may later be driven with a voltage in the range from 0 to 10 V. A voltage $U_1$ and/or $U_2$ that may be applied for the fixation may have a value of approximately 100 V. Before bringing them together, the electrodes 18a, 18b and 18c were covered with the non-conductive layer 38.

In other words, the electrodes were covered with a non-conductive layer before being brought together. Alternatively, covering may also only be carried out at those points where the mechanical connection of the electrodes is to take place, e.g. at the locking geometries. Alternatively, the insulating layer may also be arranged at other additional spots.

Figure 4:
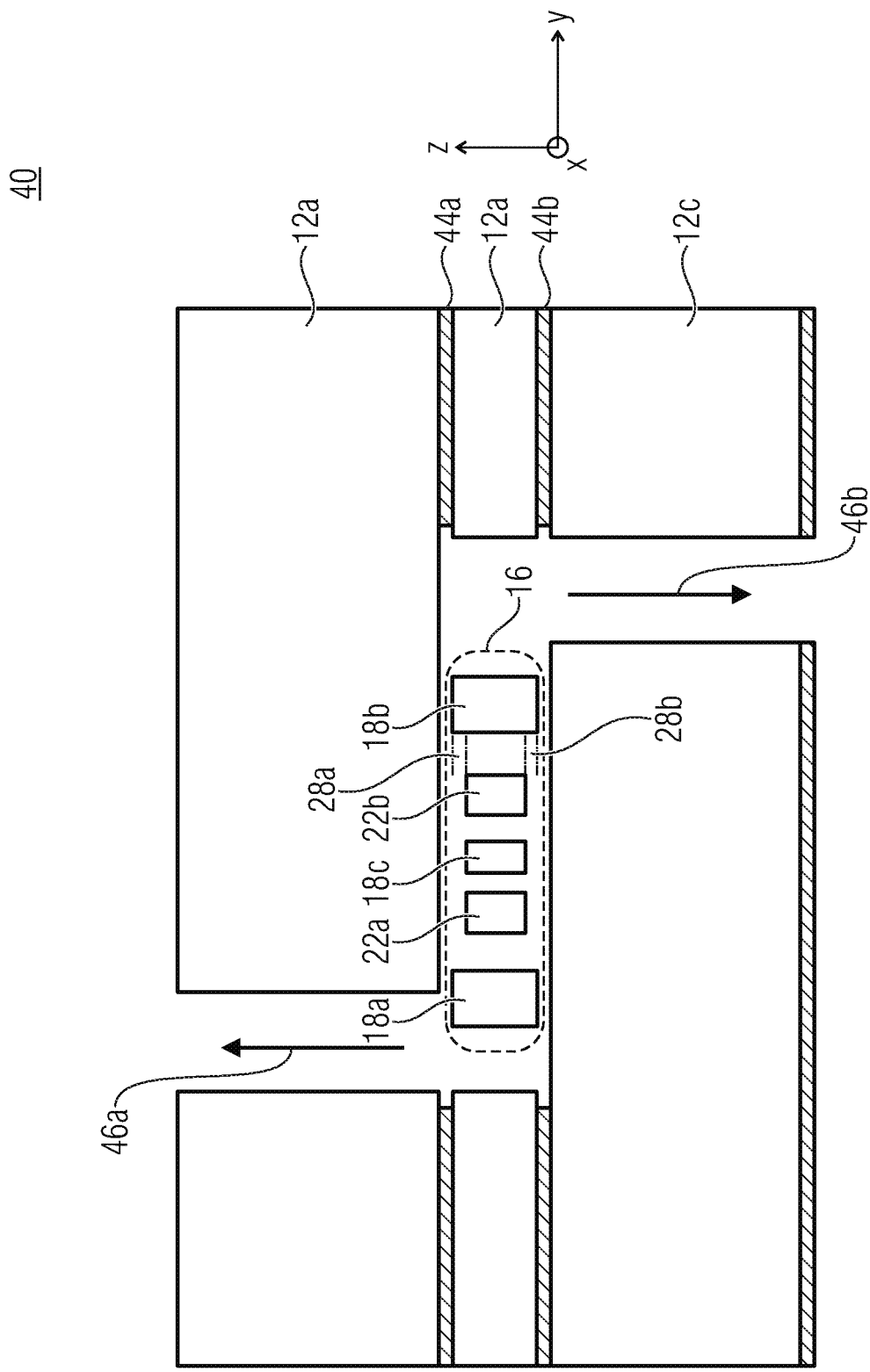
FIG. 4 shows a schematic side-sectional view of a MEMS converter according to an embodiment.

FIG. 4 shows a schematic side-sectional view of a MEMS converter 40 according to an example. For example, the MEMS converter 40 may be a sound converter, such as a loudspeaker or a microphone. Although the MEMS Converter 40 is described below as a MEMS loudspeaker, its operation may also be transferred to a MEMS microphone when an applied voltage is detected, i.e. is measured, rather than applying it in the case of a loudspeaker to obtain a movement of the movable element 16. For example, the MEMS loudspeaker 40 may include the MEMS 10, 20 and/or 30. Instead of a sound converter, the MEMS converter 40 may also form a pump, a valve, a dosing system, an acceleration sensor, a rotation rate sensor, a micro-positioning system, a micro-stabilizer, e.g. for image sensors, and/or a micro-switch (e.g. for high frequency or high voltage applications).

The discrete areas 22a and 22b and the corresponding implementations of connection elements may be arranged obliquely in the space, i.e. inclined within the substrate plane, so that in the illustrated cross-sectional plane only parts of the connection elements connecting the electrodes 18a and 18c or 18b and 18c, respectively, are shown. The substrate 12 may comprise several layers 12a, 12b and 12c. For example, the layer 12a may be referred to as lid wafer, the layer 12b may be referred to as device layer and layer 12c may be referred to as handle wafer. Between the layers 12a and 12b there may be arranged an insulating layer or etching stop layer, e.g. including $SiO_2$ or the like. The layer 44a may have a thickness of, e.g., 1 μm. Between the layers 12b and 12c there may be arranged a similar layer, e.g., also including $SiO_2$ and also comprising a layer thickness of about 1 μm. According to further embodiments, the layers may also have a different layer thickness. As shown by the arrows 46a and 46b, the movement of the movable element 16 in the substrate plane x/y may cause a movement of the fluid surrounding the movable element along the arrow directions of the arrows 46a and/or 46b so that the fluid pressure may be emitted along the positive thickness direction and the negative thickness direction. By closing one of the openings, the fluid flow may also be provided with a preferred direction. The MEMS converter 40 may also be used as a MEMS pump by arranging a passive valve which, like a check valve, reduces or prevents fluid flow along one direction. According to further implementations, the MEMS converter 40 may be used as a valve, dosing system, acceleration sensor, rotation rate sensor, micro-positioning system, micro-stabilizer (e.g. for image sensors), micro-switch (e.g. for high frequency and/or high voltage applications).

In other words, when a control voltage U is applied between the electrodes 18a/18b and 18c, the LNED actuator 40 moves laterally in the x/y-plane. When the LNED actuator is applied with a voltage, the layers 12a, 12b and 12c may also be contacted with a potential, e.g. be grounded, to ensure or enable a reproducible movement of the LNED actuator. The assignment of the electrical control voltage shown below may be useful or needed in normal operation. Electrodes 18a and 18b may be grounded, i.e. connected to 0 V. The same may apply to the layers 12a, 12b and 12c. A control voltage may be applied to the electrode 18c, such as an analog audio signal for use as a MEMS loudspeaker or a corresponding signal for use as a MEMS pump.

Based on FIGS. 5a to 5l, a manufacturing process for manufacturing MEMS structures according to embodiments is described below.

Figure 5A:
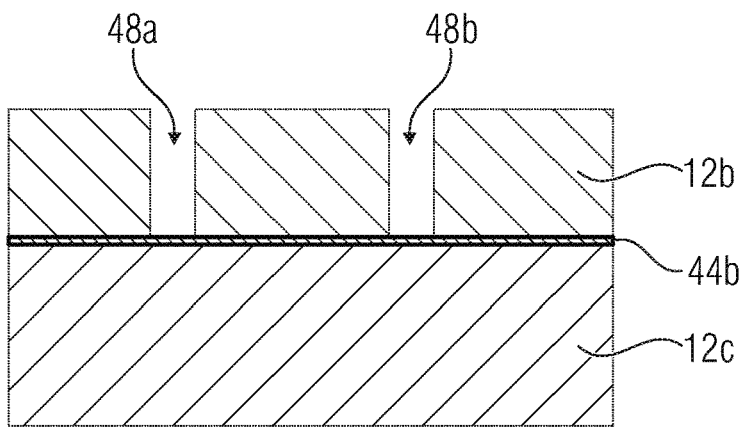

FIG. 5a shows providing a substrate including the layers 12b and 12c that are separated by the layer 44b. Trenches 48a and 48b that later define the electrode gaps, e.g. the gaps between the electrodes that are still to be reduced, may be inserted in the layer 12b. For example, this may be done by DRIE etching the layer 44b with a boundary (stop) on BOX.

Figure 5B:
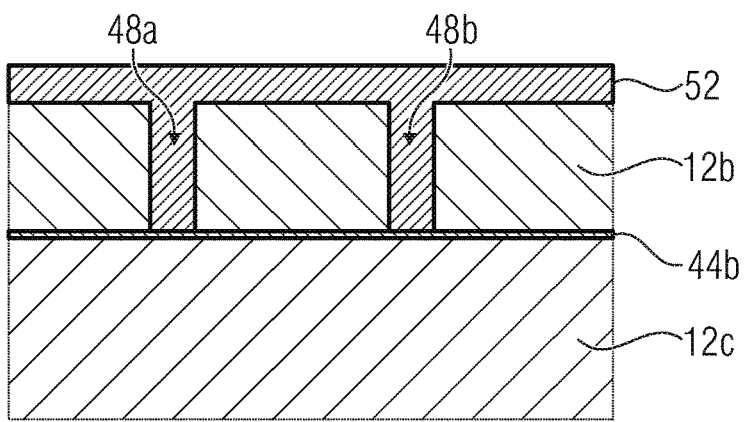

FIG. 5b shows the filling of the trenches 48a and 48b with an insulating material, e.g. $SiO_2$, wherein a main side surface of layer 12b facing away from the layer 12c may also be covered with $SiO_2$.

Figure 5C:
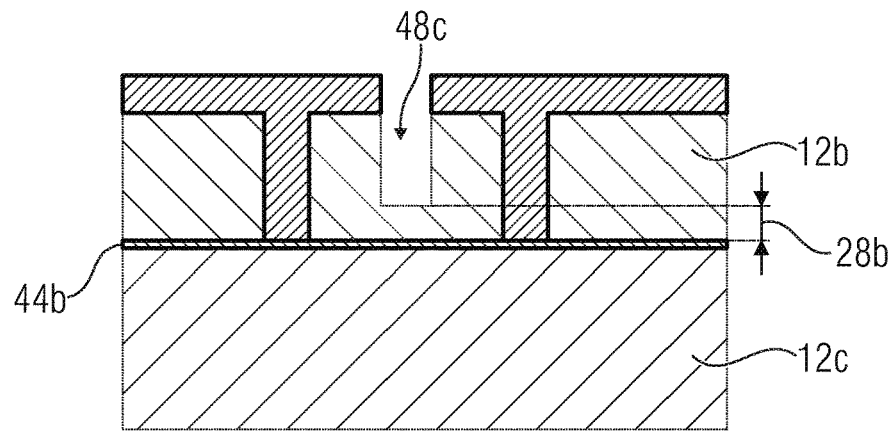

FIG. 5c shows a schematic view of the layer stack, wherein a trench 48c is etched, e.g. Recess-RC trench etching. To define the overhang 28b, the etching of the trench 48c may be performed so that the layer 44b is not reached, that is, the layer 12b is not completely penetrated and DRIE etching is stopped after a number of time or process cycles.

Figure 5D:
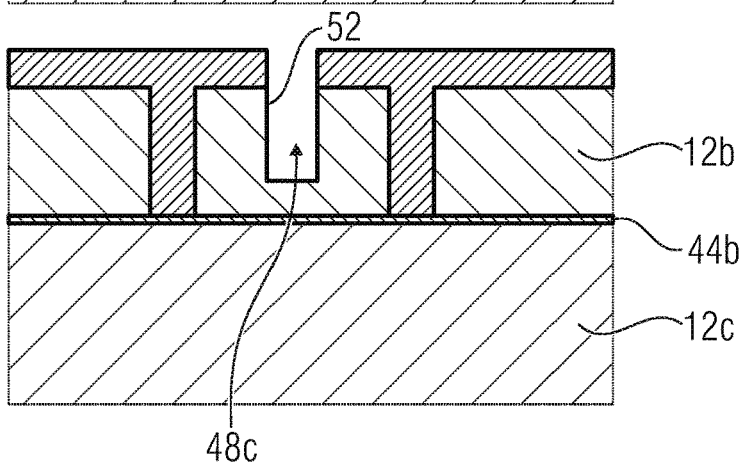

FIG. 5d shows a schematic view of the stack of layers, wherein a layer 52 that insulates or inhibits the etching process of the substrate 12b or 12c has been deposited in trench 48c, e.g. an $SiO_2$ layer or another electrically insulating layer.

Figure 5E:
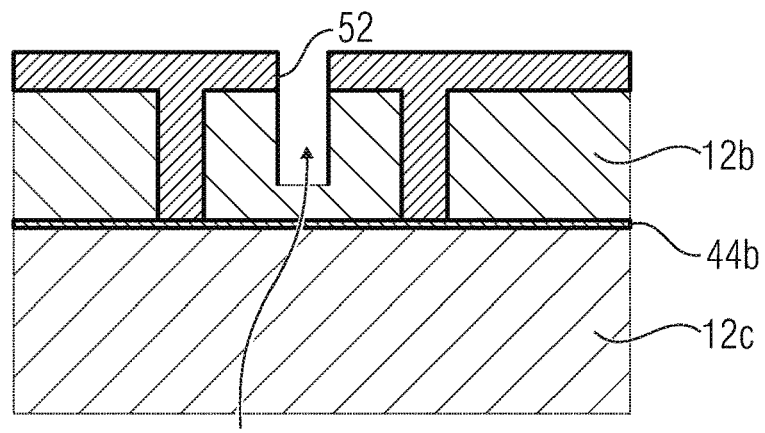

FIG. 5e shows a schematic view of the layer stack, wherein the previously deposited layer 52 is removed from a bottom of trench 48c, e.g. by $SiO_2$ etching at the bottom of the RC trench.

Figure 5F:
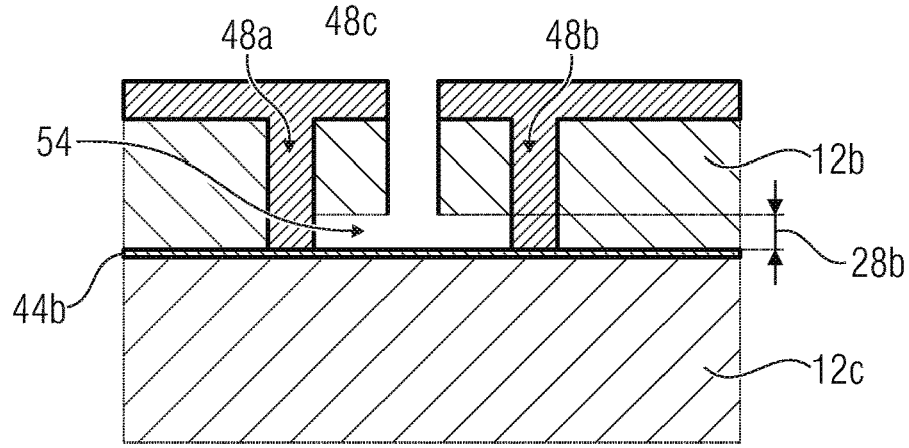

FIG. 5*f* shows a schematic side-sectional view of the layer stack, wherein isotropic Si etching is carried out after removing the layer 52 from the bottom of the trench so that the layer 12*b* is removed between the trenches 48*a* and 48*b*. The isotropic etching process allows the recess 28*b*, or overhang 28*b*, to be created by the remaining material having a reduced expansion. A cavity 54 may remain between the remaining material of the layer 12*b* and the layer 12*c* and/or 44*b*.

Figure 5G:
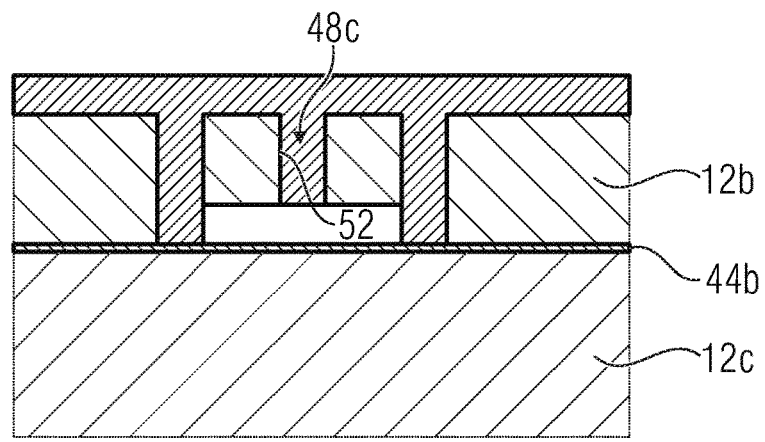

FIG. 5*g* shows a schematic side-sectional view of the stack, wherein the RC trench 48*c* is filled with an etch stop material such as SiO$_2$. This may be done in such a way that a surface facing the layer 12*c* that has the width of the layer 12*b* that is exposed by the cavity 54 is covered by the layer 52.

Figure 5H:
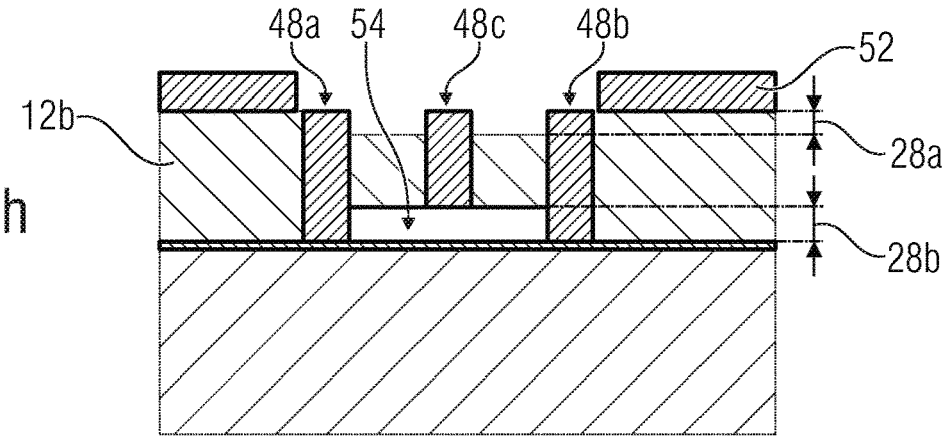

FIG. 5*h* shows a schematic side-sectional of the stack, wherein the material of the layer 52 is removed in the area between the trenches 48*a* and 48*b* and in the area covering the cavity 54. In addition, the layer 12*b* may be partially etched back to generate the upper overhang 28*a*. It becomes obvious that, due to the staggered generation of the overhangs 28*a* and 28*b*, these may also have different dimensions.

Figure 5I:
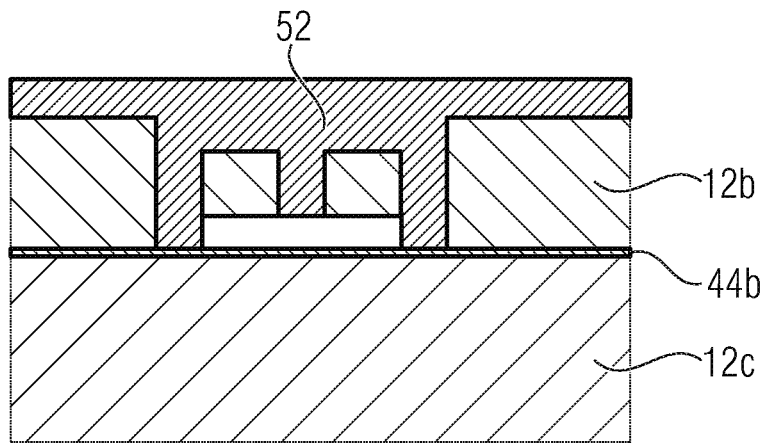

FIG. 5*i* shows a schematic side-sectional view of the stack, wherein the area exposed in FIG. 5*h* and the volume of the etched-back layer 12*b* is filled with the material of the layer 52, i.e. the stack is filled with SiO$_2$, for example.

Figure 5J:
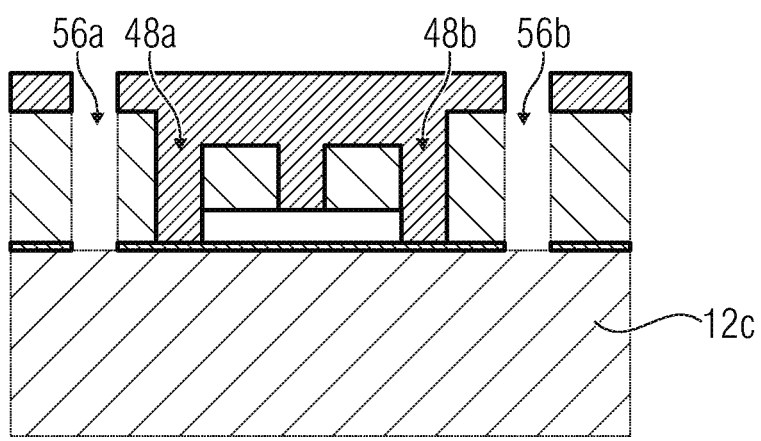

FIG. 5*j* shows a schematic side-sectional view of the stack, wherein open trenches 56*a* and 56*b* are etched in a lateral area external to the trenches 48*a* and 48*b*. The open trench 56*a* and/or 56*b* may be openings that define the air chambers and/or pump chambers.

Figure 5K:
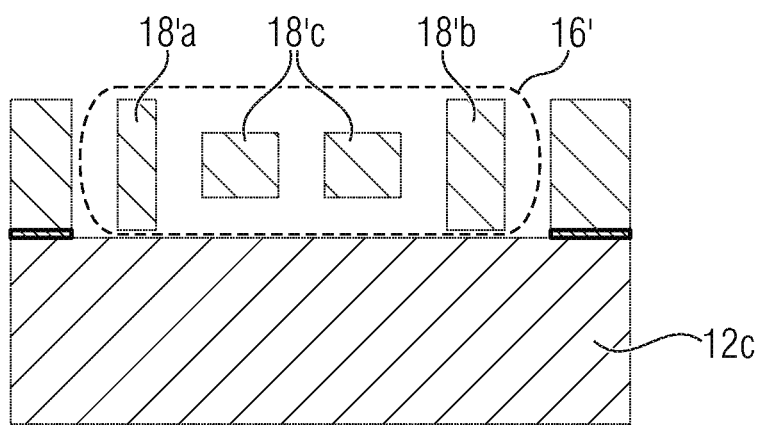
Figure 5I:
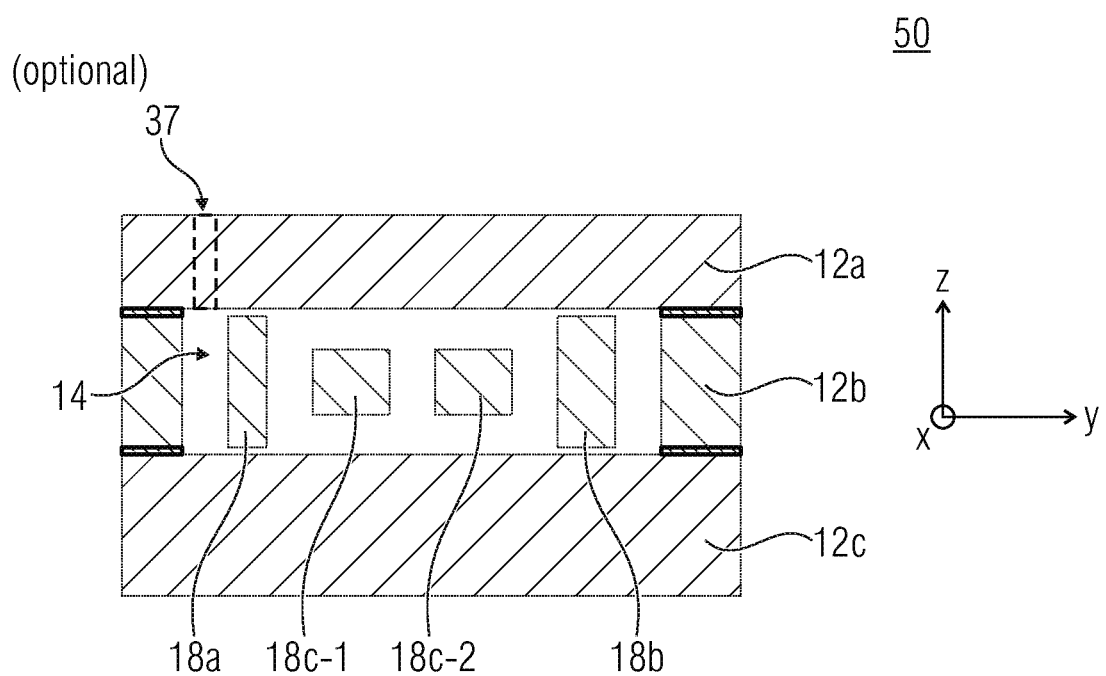

FIG. 5*k* shows a schematic side-sectional view of the layer stack, wherein elements 18'*a*, 18'*b* and 18'*c*, which will later form the electrodes 18*a*, 18*b* and 18*c*, are exposed. This means that a release etching is performed, for example with a hydrofluoric acid gas phase etching of the LNED beam. As soon as the elements 18'*a*, 18'*b* and/or 18'*c* are contacted, they may be used as the electrodes.

FIG. 5*l* shows a schematic side-sectional view of the stack, wherein the cavity 14 is closed by attaching the layer 12*a*, wherein the layer 12*a*, the layer 12*b* and/or the layer 12*c* may have optional openings 38 to permit an inflow or outflow of a fluid into or from the cavity 14. In the MEMS 50 thus obtained, the movable element comprises two electrodes 18*c*-1 and 18*c*-2, which may have a potential difference to the electrodes 18*a* and 18*b*. The electrodes 18*c*-1 and 18*c*-2 may be configured to comprise the same electrical potential, e.g. by being electrically connected to each other. Alternatively or additionally, the electrodes 18*c*-1 and 18*c*-2 may be integrally connected elements between which a trench or a hole structure is arranged, e.g. to allow underlying etching. Such an arrangement of two electrodes between the outer electrodes 18*a* and 18*b* may allow individual deflection of the movable element along any direction in the substrate plane. Instead of the electrodes 18*c*-1 and 18*c*-2, the electrode 18*c* alone may also be arranged or a different number of the electrodes may be arranged, e.g. more than 2, more than 3 or more than 4.

As described, a method of manufacturing a MEMS therefore includes providing a substrate according to the first aspect, such as the MEMS 10. Here the substrate may be provided in such a way that a cavity is generated in the further course or that the cavity has already been generated. A cavity may be generated later when some elements are formed and exposed in the substrate. A movable member is arranged in the cavity 14, the movable member including a first electrode, such as the electrode 18*a*, a second electrode, such as the electrode 18*b*, and a third electrode, such as the electrode 18*c*, that is arranged between the first and second electrodes. The third electrode is fixed in an electrically insulated manner with the first and second electrode at discrete areas, as described in connection with the MEMS 10. The first, second and third the electrodes are arranged such that the movable member performs a movement along a movement direction in a substrate plane, i.e. the x/y plane, in response to an electrical potential between the first electrode and the third electrode or in response to an electrical potential between the second electrode and the third electrode. The third electrode is arranged such that a dimension of the third electrode perpendicular to the substrate plane, i.e. along the z-direction, is less than a dimension of the first electrode 18*a* and a dimension of the second electrode 18*b* perpendicular to the substrate plane.

Fixing the first electrode, the second electrode to the third electrode may be done in such a way that the same are under mechanical tension in a state without the electrical potential, so that the first and the second electrode move away from the third electrode as a result of separation of the fixation.

A method of manufacturing a MEMS according to the second aspect includes providing a substrate. Furthermore, forming a first electrode in a cavity of the substrate so that the first electrode is suspended from the substrate is carried out. Further, forming a second electrode in the cavity of the substrate so that the second electrode is suspended from the substrate is carried out. Forming a third electrode in a cavity of the substrate between the first electrode and the second electrode is carried out. The method includes fixing the first electrode, the second electrode and the third electrode with each other and in an electrically insulated manner at discrete areas so that the first, second and third the electrodes move along a movement direction in a substrate plane in response to an electrical potential between the first electrode and the third electrode or between the second electrode and the third electrode, and so that the first electrode and the second electrode are under mechanical tension in a state without the electrical potential, so that the first and second electrodes move away from the third electrode as a result of separation of the fixation.

It should be noted that the intermediate products described in the context of FIGS. 5*a* to 5*l* may meet the requirements of the first aspect and, alternatively or additionally, the requirements of the second aspect. This means that overhangs 28*a* and/or 28*b* may be dispensed with and/or the electrodes 18*a* and 18*b* may be formed from the substrate layer 12*b* in such a way that the spring elements explained in connection with FIGS. 2*a* and 2*b* are formed.

Embodiments refer to devices that are based on LNED where a recess is formed at the bottom side and top side of the center electrode, with the outer electrodes acting as an electrical shielding function. Other embodiments refer to loudspeakers and/or micropumps with such a MEMS. Embodiments also refer to components based on LNED that comprise an aspect ratio of the LNED gap, which, together with subsequently bringing together the electrodes, results in an aspect ratio of more than 30. For example, aspect ratios may comprise a value in a range of at least 50, at least 100, at least 200, at least 400, or even higher. At the same time, the aspect ratio of at least 50 may comprise an upper limit of 10,000 or more, the aspect ratio of at least 100 or at least 200 may comprise an upper limit of 7,000 or more and/or the aspect ratio of at least 400 may comprise an upper limit of 3,500 or more. This means that the expansion 24 of the MEMS in FIG. 3b is greater by the value of the aspect ratio than a dimension of the gap 42'.

LNED actuators according to the embodiments described herein may be used for acceleration sensors, gyroscopes and angular rate sensors based on MEMS and generally for all MEMS in which a micro-component is to be mechanically moved in the substrate plane and is encapsulated by a lid substrate and bottom substrate.

Based on FIGS. 6a to 6q, a further manufacturing method is described below with which, e.g., the MEMS 20 may be manufactured.

Figure 6B:
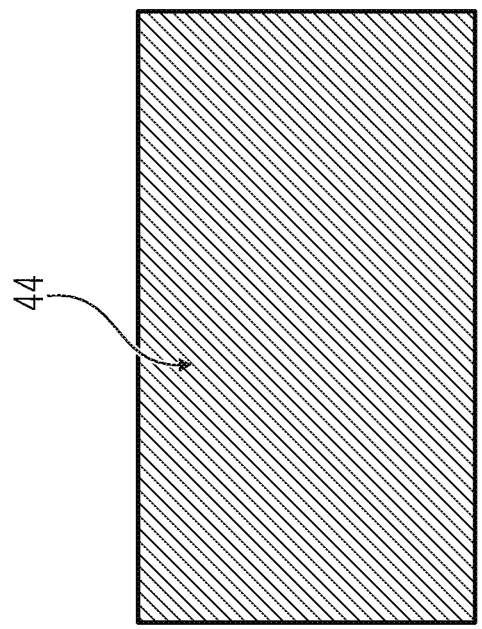
FIGS. 6a to 6q show manufacturing method of manufacturing MEMS structures according to another example.
Figure 6A:
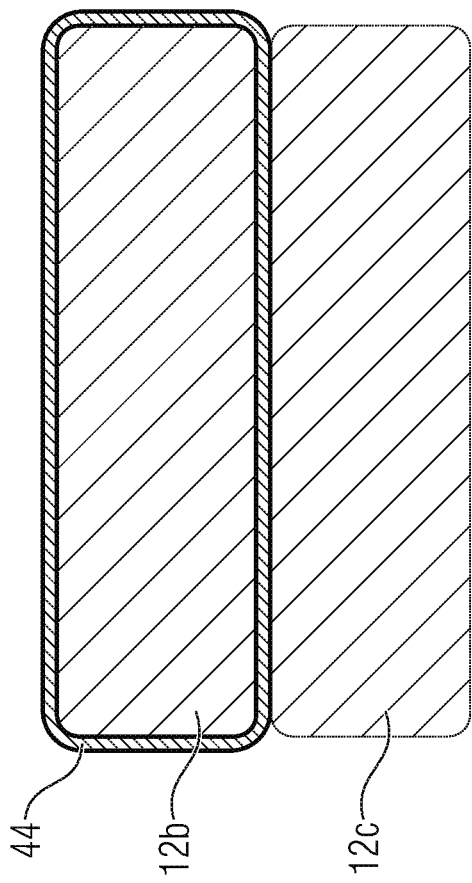

FIG. 6a shows a schematic side-sectional view of a layer stack or wafer bond including the layers 12c and 12b. The layer 12b may be at least partially but also completely covered by the layer 44b, so that the layers 12b and 12c are separated from each other by the layer 44b and are electrically insulated from each other if needed.

FIG. 6b shows a schematic top view of the layer stack from FIG. 6a.

Figure 6D:
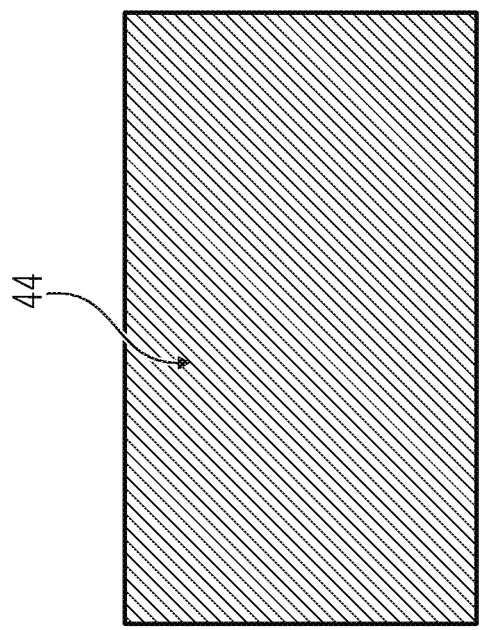
Figure 6C:
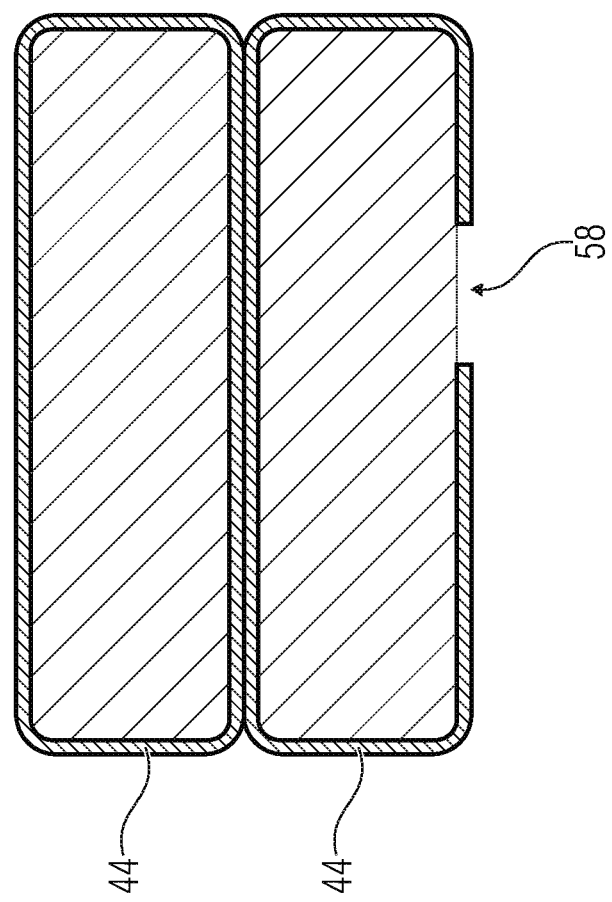

FIG. 6c shows a schematic top view of a layer stack that may be obtained, e.g., from the layer stack according to FIG. 6a and wherein the layer 12c is also covered by a material of the layer 44b. On one side facing away from the layer 12b, this enclosure may have an opening 58.

FIG. 6d shows a schematic top view of the layer stack from FIG. 6c.

Figure 6F:
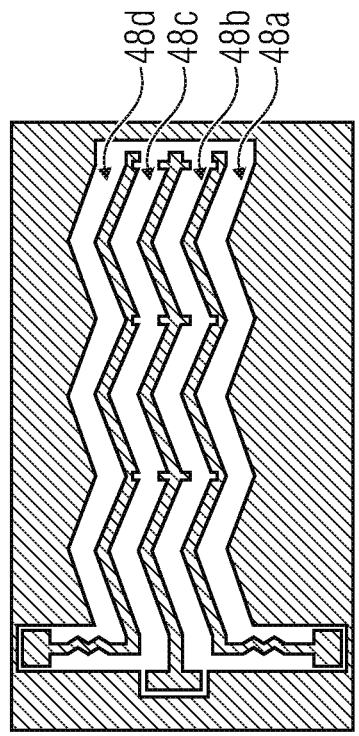
Figure 6E:
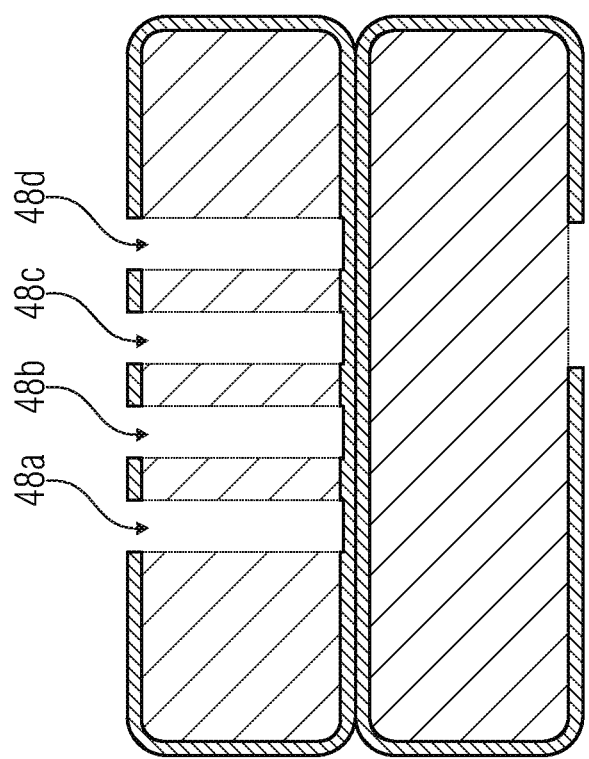

FIG. 6e shows a schematic side-sectional view of a layer stack that may be formed from the layer stack according to FIG. 6c, e.g. by etching trenches 48a to 48d into the layer 12b. The trenches may have a depth of 725 µm, for example.

FIG. 6f shows a schematic top view of the layer stack from FIG. 6e. The trenches 48a to 48d may form structures of the electrodes 18a to 18c. Some or all of the trenches 48a to 48d may be fluidically connected to each other and form a common trench.

Figure 6H:
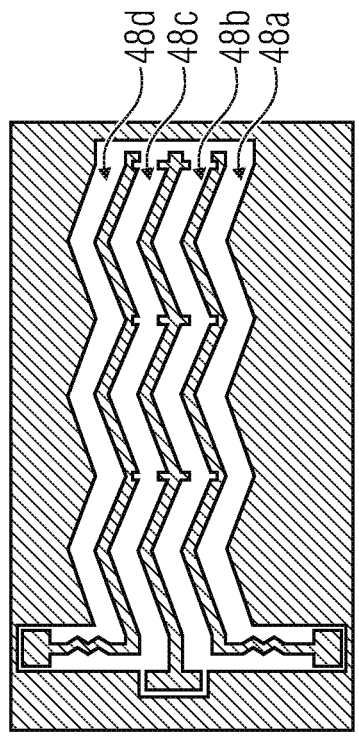
Figure 6G:
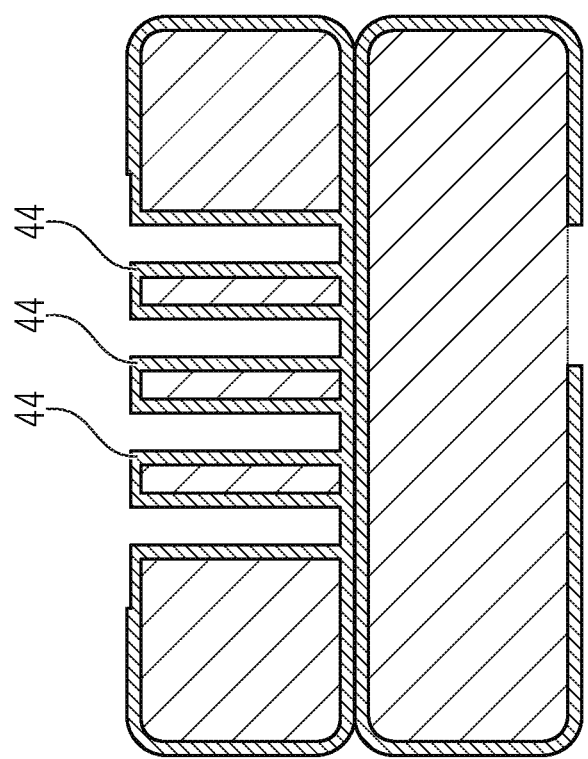

FIG. 6g shows a schematic side-sectional view of a layer stack that may be formed from the layer stack according to FIG. 6e, e.g. by depositing the layer 44 on walls of the trenches 48a to 48d. This may be achieved by plasma enhanced (PE) deposition of undoped silicon glass (USG) on a front side of the wafer.

FIG. 6h shows a schematic top view of the layer stack from FIG. 6g.

Figure 6J:
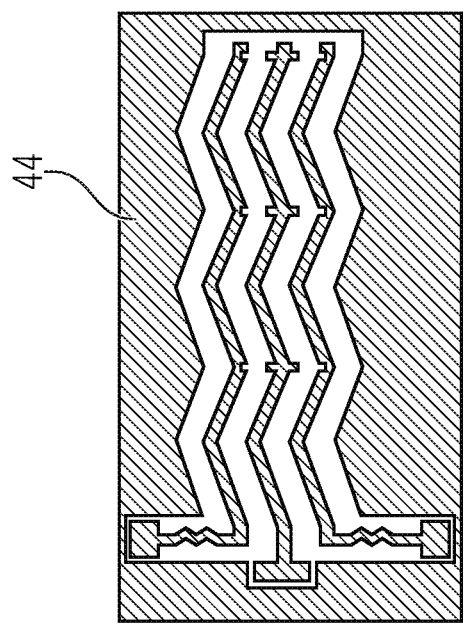
Figure 6I:
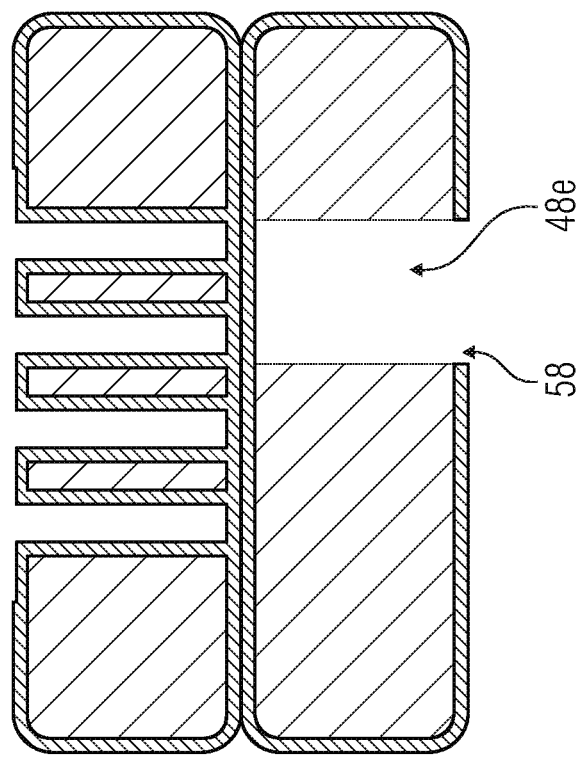

FIG. 6i shows a schematic side-sectional view of a layer stack that may be formed from the layer stack according to FIG. 6g, e.g., by partially removing the layer 12c through the opening 58 to form a trench 48e. Although the opening 58 is already shown in FIG. 6c, it may also be generated later. The trench may be formed up to the layer 44, e.g., including $SiO_2$.

FIG. 6j shows a schematic top view of the layer stack from FIG. 6i, wherein the view corresponds to FIG. 6h.

Figure 6L:
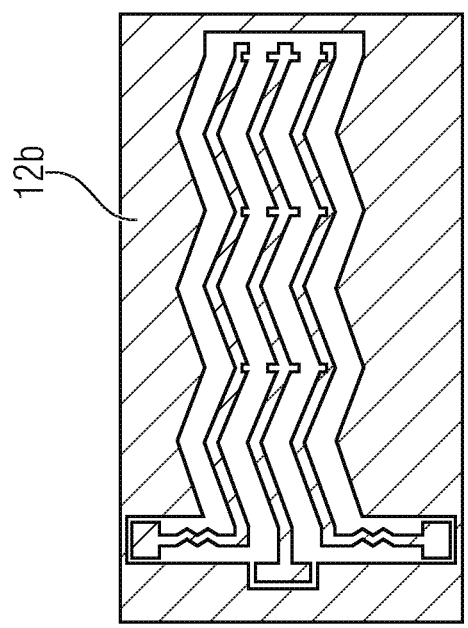
Figure 6K:
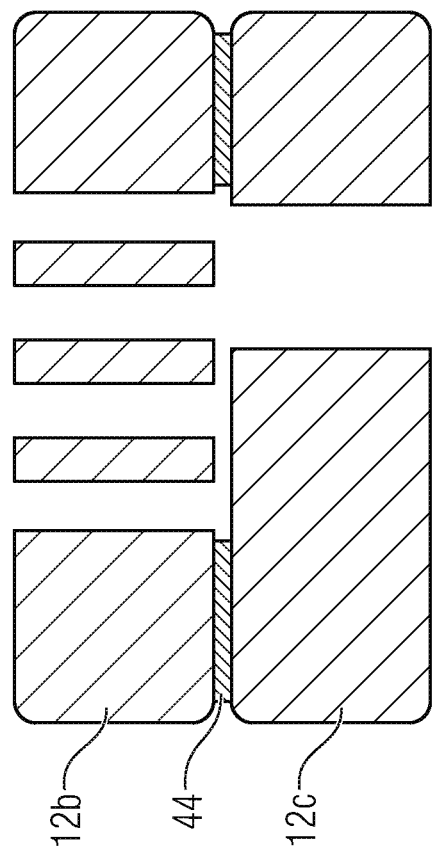

FIG. 6k shows a schematic side-sectional view of a layer stack that may be formed from the layer stack according to FIG. 6i, e.g., by removing the layer 44 in portions, so that the electrodes 18a to 18c are exposed and the layer stack is at least partially or completely freed of the layer 44 at outer circumferential surfaces, but the layer 44 is still arranged between the layers 12b and 12c. A release, i.e. exposure, of the movable elements may take place.

FIG. 6l shows a schematic top view of the layer stack from FIG. 6k, which shows a distance of the electrodes 18a to 18c according to the state of the MEMS 20 of FIG. 2a.

Figure 6N:
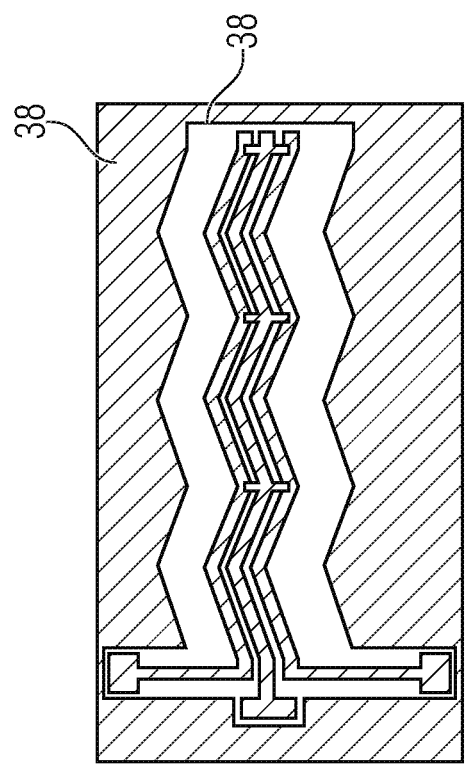
Figure 6M:
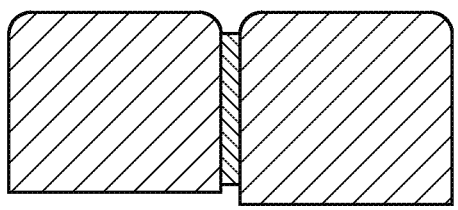
Figure 6M:
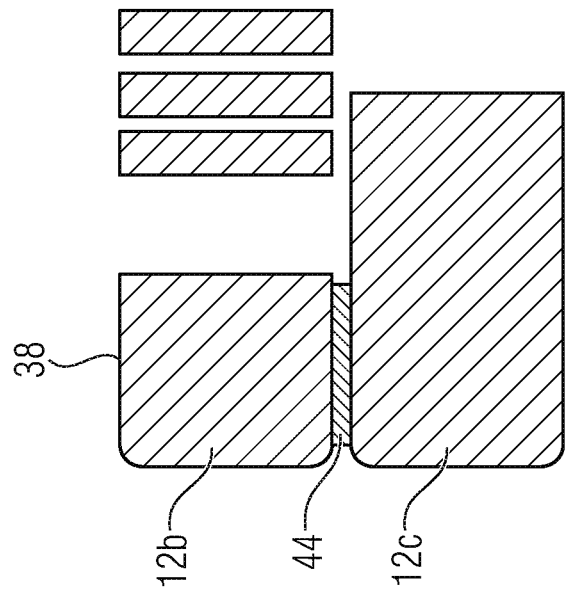

FIG. 6m shows a schematic side-sectional view of a layer stack that may be formed from the layer stack according to FIG. 6k, e.g., by moving the electrodes 18a to 18c towards each other and fixing them. Fixing may be done by arranging the layer 38. Alternatively, the layer 38 may also be arranged at a different time, e.g. earlier, and the fixation may be maintained by another concept described herein. For example, the layer 38 may be arranged using an Atomic Layer Deposition (ALD) process. Alternatively or additionally, the layer 38 may also be arranged as spray paint.

FIG. 6n shows a schematic top view of the layer stack from FIG. 6m, showing the MEMS 20 in the condition according to FIG. 2b.

FIG. 6o shows a schematic side-sectional view of a layer stack that may be formed from the layer stack according to FIG. 6m. The layer 12b may be coated with an insulating layer, such as the layer 38, wherein cut-outs 62 may be made in order to allow the layer 12b to be contacted through the layer 38.

FIG. 6p shows a schematic top view of the layer stack from FIG. 6o.

Figure 6Q:
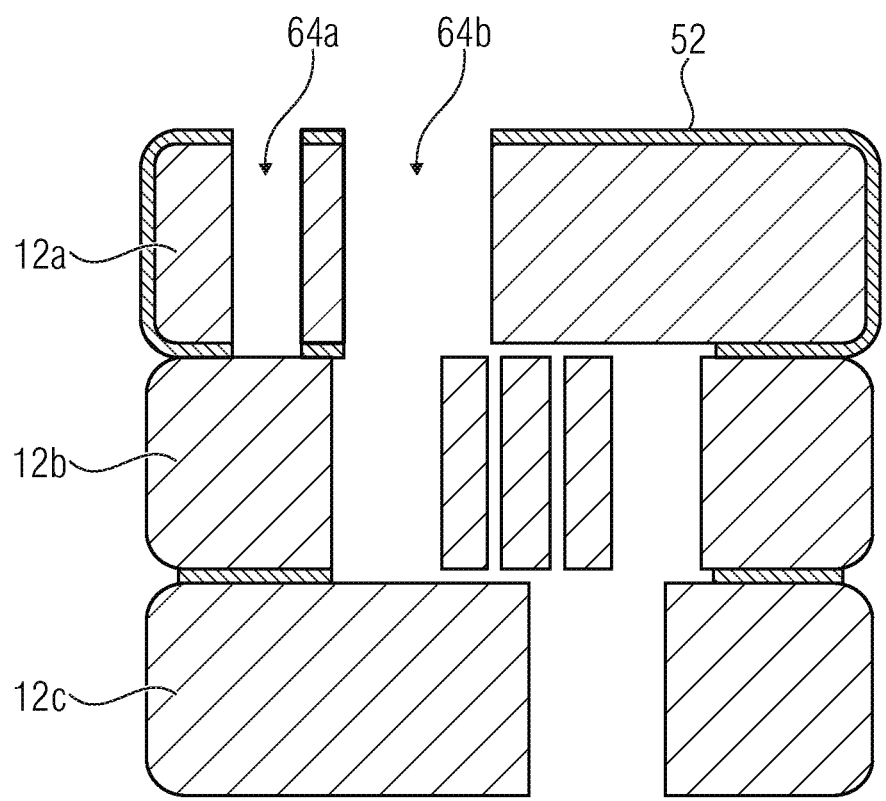

FIG. 6q shows a schematic side-sectional view of a layer stack that may be formed from the layer stack according to FIG. 6o, e.g. by arranging the layer 12a. Wafer bonding may be used for this purpose. The layer 12a may be placed on the stack at a distance from the layer 12b due to the insulation layer 52 and may comprise openings 64a and/or 64b, which allow contact with the underlying layers 12b, cf. opening 64a, and/or allow fluidic contact of the MEMS with the surroundings, cf. opening 64b. Further steps may be carried out to deposit or remove layers completely or partially.

Additional embodiments and aspects of the invention will be described which can be used individually or in combination with the features and functionalities described herein.

According to a first aspect, a MEMS 10; 20; 30; 50 includes: a substrate 12 comprising a cavity 14; a moveable element 16 arranged in the cavity 14, the moveable element including a first electrode 18a, a second electrode 18b and a third electrode 18c that is arranged between the first electrode 18a and the second electrode 18b and is fixed in an electrically insulated manner from the same at discrete areas 22a-f; wherein the moveable element 16 is configured to perform a movement along a movement direction y in a substrate plan x/y in response to an electric potential between the first electrode 18a and the third electrode 18c or in response to an electric potential between the second electrode 18b and the third electrode 18c; wherein a dimension 26 of the third electrode 18c perpendicular to the substrate plane x/y is lower than a dimension 24 of the first electrode 18a and a dimension 24 of the second electrode 18b perpendicular to the substrate plane x/y.

According to a second aspect when referring back to the first aspect, the dimension 26 of the third electrode 18c perpendicular to the substrate plane x/y is lower by at least 2% than the dimension 24 of the first electrode 18a and the dimension 24 of the second electrode 18b perpendicular to the substrate plane x/y.

According to a third aspect when referring back to the first aspect or second aspect, the first electrode 18a and the second electrode 18b comprise an overhang 28a, 28b with respect to the third electrode 18c along a positive and a negative direction z perpendicular to the substrate plane x/y.

According to a fourth aspect when referring back to any one of the preceding aspects, the first electrode 18a is connected to the substrate 12 via a tensioned first spring element 36a, and wherein the second electrode 18b is connected to the substrate 12 via a tensioned second spring element 36b.

According to a fifth aspect when referring back to any one of the preceding aspects, a distance between the first electrode 18a and the substrate 12 and between the second electrode 18*b* and the substrate 12 along a direction perpendicular to the movement direction y is less than 1 µm.

According to a sixth aspect, a MEMS 20; 30; 50 includes: a substrate 12 comprising a cavity 14; a moveable element 16 arranged in the cavity 14, the moveable element including a first electrode 18*a* connected to the substrate 12, a second electrode 18*b* connected to the substrate 12 and a third electrode 18*c* that is arranged between the first electrode 18*a* and the second electrode 18*b* and is connected to the substrate 12, the third electrode being fixed with the first electrode 18*a* and the second electrode 18*b* in an electrically insulated manner with a fixation at discrete areas 22*a-f*; wherein the moveable element 16 is configured to perform a movement along a movement direction y in a substrate plan x/y in response to an electric potential between the first electrode 18*a* and the third electrode 18*c* or in response to an electric potential between the second electrode 18*b* and the third electrode 18*c*; wherein the first electrode 18*a* and the second electrode 18*b* are under mechanical tension in a state without the electric potential so that the first electrode 18*a* and the second electrode 18*b* move away from the third electrode 18*c* as a result of separating the fixation or are held with respect to the third electrode by means of a multi-stable structure.

According to a seventh aspect when referring back to the sixth aspect, the first electrode 18*a* and the second electrode 18*b* are connected to the substrate 12 via spring elements 36*a*, 36*b*, wherein the spring elements 36*a*, 36*b* provide the mechanical tension.

According to an eighth aspect when referring back to the seventh aspect, the spring elements 36*a*, 36*b* are spring elements under tensile stress, or wherein the spring elements 36'*a-d* are multi-stable elements.

According to a ninth aspect when referring back to any one of the sixth to eighth aspects, the first electrode 18*a* and the second electrode 18*b* comprise a dimension 24 perpendicular z to a movement direction y of the moveable elements 16 of more than 150 µm.

According to a tenth aspect when referring back to any one of the sixth to ninth aspects, a dimension 26 of the third electrode 18*c* perpendicular to the substrate plane x/y is lower than a dimension 24 of the first electrode 18*a* and a dimension 24 of the second electrode 18*b* perpendicular to the substrate plane x/y.

According to an eleventh aspect when referring back to any one of the preceding aspects, a fixation between the first electrode 18*a* and the third electrode 18*c* or between the second electrode 18*b* and the third electrode 18*c* at the discrete areas 22*af* includes at least one of: mechanical latching; electrostatic sticking; surface forces; surface forces during a drying process; electrostatic attraction; thermal activation of an interface between two surfaces; fixation by subsequent deposition of a thin layer; and chemical adhesive connection.

According to a twelfth aspect when referring back to any one of the preceding aspects, an insulation layer 38; 52 is arranged at least at one of the first electrode 18*a*, the second electrode 18*b* and the third electrode 18*c*.

According to a thirteenth aspect when referring back to any one of the preceding aspects, an aspect ratio of a distance between the first electrode 18*a* and the third electrode 18*c* and a dimension of the first electrode 18*a* along a direction perpendicular to the movement direction y is larger than 100; or wherein an aspect ratio of a distance between the second electrode 18*b* and the third electrode 18*c* and a dimension of the second electrode 18*b* along the direction perpendicular to the movement direction y is larger than 100.

According to a fourteenth aspect, a MEMS 20' includes: a substrate 12 comprising a cavity 14; a moveable element 16 arranged in the cavity 14, the moveable element including a first electrode 18*a*, a second electrode 18*b*, and a third electrode 18*c* that is arranged between the first electrode 18*a* and the second electrode 18*b*, the third electrode being fixed with the first electrode 18*a* and the second electrode 18*b* in an electrically insulated manner with a fixation at discrete areas 22*a-f*; wherein the moveable element 16 is configured to perform a movement along a movement direction y in a substrate plan x/y in response to an electric potential between the first electrode 18*a* and the third electrode 18*c* or in response to an electric potential between the second electrode 18*b* and the third electrode 18*c*; wherein the first electrode 18*a* and the second electrode 18*b* are spaced apart from the third electrode 18*c* by means of a functional layer 38; 52 and are connected in a mechanically fixed manner at the discrete areas; wherein at least one of the first electrode 18*a*, the second electrode 18*b* and the third electrode 18*c* is connected to the substrate via a spring element; wherein at least one of the first electrode 18*a*, the second electrode 18*b* and the third electrode 18*c* is connected to the substrate exclusively indirectly via a neighboring electrode.

According to a fifteenth aspect when referring back to the fourteenth aspect, an aspect ratio of a distance between the first electrode 18*a* and the third electrode 18*c* and a dimension of the first electrode 18*a* along a direction perpendicular to the movement direction y is larger than 100; or wherein an aspect ratio of a distance between the second electrode 18*b* and the third electrode 18*c* and a dimension of the second electrode 18*b* along the direction perpendicular to the movement direction y is larger than 100.

According to a sixteenth aspect, a MEMS 20; 20'; 20"; 30; 50 includes: a substrate 12 comprising a cavity 14; a moveable element 16 arranged in the cavity 14, the moveable element including a first electrode 18*a*, a second electrode 18*b*, and a third electrode 18*c* that is arranged between the first electrode 18*a* and the second electrode 18*b*, the third electrode being fixed with the first electrode 18*a* and the second electrode 18*b* in an electrically insulated manner with a fixation at discrete areas 22*a-f*; wherein the moveable element 16 is configured to perform a movement along a movement direction y in a substrate plan x/y in response to an electric potential between the first electrode 18*a* and the third electrode 18*c* or in response to an electric potential between the second electrode 18*b* and the third electrode 18*c*; wherein the first electrode 18*a* and the second electrode 18*b* are spaced apart from the third electrode 18*c* by means of a functional layer 38; 52 and are connected in a mechanically fixed manner at the discrete areas; wherein an aspect ratio of a distance between the first electrode 18*a* and the third electrode 18*c* and a dimension of the first electrode 18*a* along a direction perpendicular to the movement direction y is larger than 100; or wherein an aspect ratio of a distance between the second electrode 18*b* and the third electrode 18*c* and a dimension of the second electrode 18*b* along the direction perpendicular to the movement direction y is larger than 100.

According to a seventeenth aspect when referring back to the sixteenth aspect, at least one of the first electrode 18*a*, the second electrode 18*b* and the third electrode 18*c* is connected to the substrate exclusively indirectly via a neighboring electrode.

According to an eighteenth aspect when referring back to any one of the preceding aspects, the MEMS is configured to provide an electrostatic force in response to the electric potential.

According to an nineteenth aspect when referring back to any one of the preceding aspects, the main sides of the first, second and third electrodes 18a-c are arranged perpendicular to the substrate plane.

According to a twentieth aspect, a device having a MEMS according to any one of the preceding aspects is configured as an acoustic transducer, a pump, a valve, a dosage system, an acceleration sensor, a rotation rate sensor, a micro-positioning system, a micro-stabilizer or a micro-switch.

According to a twenty-first aspect, a method of manufacturing a MEMS comprises: providing a substrate 12 having a first cavity 14; arranging, in the cavity 14, a movable element 16 including a first electrode 18a, a second electrode 18b and a third electrode 18c that is arranged between the first electrode and the second electrode 18b so that the third electrode 18c is fixed with the first electrode and the second electrode 18b in an electrically insulated manner at discrete areas 22a-f; wherein the first, second and third electrodes 18a, 18b, 18c are arranged such that the movable element 16 performs a movement along a movement direction y in a substrate plane x/y in response to an electric potential between the first electrode 18a and the third electrode 18c or in response to an electric potential between the second electrode 18b and the third electrode 18c; wherein the third electrode 18c is arranged such that a dimension 26 of the third electrode 18c perpendicular to the substrate plane x/y is lower than a dimension 24 of the first electrode 18a and a dimension 24 of the second electrode 18b perpendicular to the substrate plane x/y.

According to a twenty-second aspect when referring back to the twenty-first aspect, the method further includes: fixing the first electrode 18a and the second electrode 18b with the third electrode 18c such that the first electrode 18a and the second electrode 18b are under mechanical tension in a state without the electric potential so that the first electrode 18a and the second electrode 18b move away from the third electrode 18c as a result of separating the fixation.

According to a twenty-third aspect, a method of manufacturing a MEMS comprises: providing a substrate 12; forming a first electrode 18a in a cavity 14 of the substrate 12 so that the first electrode 18a is suspended from the substrate 12; forming a second electrode 18b in the cavity 14 of the substrate 12 so that the second electrode 18b is suspended from the substrate 12; forming a third electrode 18c in the cavity 14 of the substrate 12 between the first electrode 18a and the second electrode 18b; fixing the first electrode 18a, the second electrode 18b and the third electrode 18c with each other and in an electrically insulated manner at discrete areas 22a-f such that the first, second and third electrodes 18a, 18b, 18c perform a movement along a movement direction y in a substrate plane x/y in response to an electric potential between the first electrode 18a and the third electrode 18c or in response to an electric potential between the second electrode 18b and the third electrode 18c, and such that the first electrode 18a and the second electrode 18b are under mechanical tension in a state without the electric potential so that the first electrode 18a and the second electrode 18b move away from the third electrode 18c as a result of separating the fixation.

According to a twenty-fourth aspect when referring back to the twenty-third aspect, the third electrode 18c is arranged such that a dimension 26 of the third electrode 18c perpendicular to the substrate plane x/y is lower than a dimension 24 of the first electrode 18a and a dimension 24 of the second electrode 18b perpendicular to the substrate plane x/y.

According to a twenty-fifth aspect when referring back to the twenty-third aspect or twenty-fourth aspect, forming the first, second and third electrodes 18a, 18b, 18c includes deep-reactive ion etching of electrode structures from the substrate 12.

According to a twenty-sixth aspect when referring back to the twenty-fifth aspect the deep-reactive ion etching is performed with an aspect ratio of trench depth to trench width having a value between 25 and 30.

According to a twenty-seventh aspect when referring back to any one of the twenty-second to twenty-sixth aspects, after fixing, the aspect ratio of trench depth to trench width has a value of at least 100 in a region between the first and third electrodes 18a, 18c and in a region between the second and third electrodes 18b, 18c.

According to a twenty-eighth aspect when referring back to any one of the twenty-second to twenty-seventh, before the step of fixing, an insulation layer 38; 52 is arranged at least at one of the first electrode 18a, the second electrode 18b and/or the third electrode 18c.

According to a twenty-ninth aspect when referring back to any one of the twenty-second to twenty-eighth aspects, fixing is performed using at least one of: mechanical latching between the first electrode 18a and the third electrode 18c or between the second electrode 18b and the third electrode 18c; electrostatic sticking between the first electrode 18a and the third electrode 18c or between the second electrode 18b and the third electrode 18c; surface forces between the first electrode 18a and the third electrode 18c or between the second electrode 18b and the third electrode 18c; surface forces during a drying process; electrostatic attraction between the first electrode 18a and the third electrode 18c or between the second electrode 18b and the third electrode 18c; thermal activation of a surface between the first electrode 18a and the third electrode 18c or between the second electrode 18b and the third electrode 18c; fixing by subsequent deposition of a thin layer; and chemical adhesive connection between the first electrode 18a and the third electrode 18c or between the second electrode 18b and the third electrode 18c.

According to a thirtieth aspect when referring back to any one of the twenty-second to twenty-ninth aspects, a dimension of a first gap 42 between the first electrode 18a and the third electrode 18c and a dimension of a second gap 42 between the first electrode 18b and the third electrode 18c are reduced during fixing the electrodes.

According to a thirty-first aspect when referring back to any one of the preceding aspects, the first electrode 18a, the second electrode 18b and the third electrode 18c are arranged such that at least one of the first electrode 18a, the second electrode 18b and the third electrode 18c is connected to the substrate exclusively indirectly via a neighboring electrode.

According to a thirty-second aspect when referring back to the thirty-first aspect, a spring element 36a-b; 36'a-d; 37 supporting the first, second and third electrodes 18ac with respect to the substrate 12 is removed after fixing the electrode to a further electrode so that the respective electrode is connected to the substrate 12 exclusively indirectly via the further electrode.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device.

The embodiments described above are merely an illustration of the principles of this invention. It goes without saying that modifications and variations of the arrangements and details described herein will be understood by other experts. Therefore, it is intended that the invention is limited only by the scope of protection of the patent claims below and not by the specific details presented in the description and explanation of the embodiments herein.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A MEMS comprising:
a substrate comprising a cavity;
a moveable element arranged in the cavity, the moveable element comprising a first electrode connected to the substrate, a second electrode connected to the substrate and a third electrode that is arranged between the first electrode and the second electrode and is connected to the substrate, the third electrode being fixed with the first electrode and the second electrode in an electrically insulated manner with a fixation at discrete areas;
wherein the moveable element is configured to perform a movement along a movement direction in a substrate plane in response to an electric potential between the first electrode and the third electrode or in response to an electric potential between the second electrode and the third electrode;
wherein the first electrode and the second electrode are under mechanical tension in a state without the electric potential so that the first electrode and the second electrode move away from the third electrode as a result of separating the fixation or are held with respect to the third electrode by means of a multi-stable structure.

2. The MEMS according to claim 1, wherein the first electrode and the second electrode are connected to the substrate via spring elements, wherein the spring elements provide the mechanical tension.

3. The MEMS according to claim 2, wherein the spring elements are spring elements under tensile stress, or wherein the spring elements are multi-stable elements.

4. The MEMS according to claim 1, wherein the first electrode and the second electrode comprise a dimension perpendicular to a movement direction of the moveable elements of more than 150 µm.

5. The MEMS according to claim 1, wherein a dimension of the third electrode perpendicular to the substrate plane is smaller than a dimension of the first electrode and a dimension of the second electrode perpendicular to the substrate plane.

6. A MEMS including:
a substrate comprising a cavity;
a moveable element arranged in the cavity, the moveable element comprising a first electrode, a second electrode and a third electrode that is arranged between the first electrode and the second electrode and is fixed in an electrically insulated manner from the same at discrete areas;
wherein the moveable element is configured to perform a movement along a movement direction in a substrate plane in response to an electric potential between the first electrode and the third electrode or in response to an electric potential between the second electrode and the third electrode;
wherein a dimension of the third electrode perpendicular to the substrate plane is smaller than a dimension of the first electrode and a dimension of the second electrode perpendicular to the substrate plane.

7. The MEMS according to claim 6, wherein the dimension of the third electrode perpendicular to the substrate plane is smaller by at least 2% than the dimension of the first electrode and the dimension of the second electrode perpendicular to the substrate plane.

8. The MEMS according to claim 6, wherein the first electrode and the second electrode comprise an overhang with respect to the third electrode along a positive and a negative direction perpendicular to the substrate plane.

9. The MEMS according to claim 6, wherein the first electrode is connected to the substrate via a tensioned first spring element, and wherein the second electrode is connected to the substrate via a tensioned second spring element.

10. The MEMS according to claim 6, wherein a distance between the first electrode and the substrate and between the second electrode and the substrate along a direction perpendicular to the movement direction is less than 1 µm.

11. The MEMS according to claim 6, wherein a fixation between the first electrode and the third electrode or between the second electrode and the third electrode at the discrete areas includes at least one of:
mechanical latching;
electrostatic sticking;
surface forces;
surface forces during a drying process;
electrostatic attraction;
thermal activation of an interface between two surfaces;
fixation by subsequent deposition of a thin layer; and
chemical adhesive connection.

12. The MEMS according to claim 6, wherein an insulation layer is arranged at least at one of the first electrode, the second electrode and the third electrode.

13. The MEMS according to claim 6, wherein an aspect ratio of a distance between the first electrode and the third electrode and a dimension of the first electrode along a direction perpendicular to the movement direction is larger than 100; or wherein an aspect ratio of a distance between the second electrode and the third electrode and a dimension of the second electrode along the direction perpendicular to the movement direction is larger than 100.

14. The MEMS according to claim 6, configured to provide an electrostatic force in response to the electric potential.

15. The MEMS according to claim 6, wherein the main sides of the first, second and third electrodes are arranged perpendicular to the substrate plane.

16. A device comprising a MEMS according to claim 6, the device being configured as an acoustic transducer, a pump, a valve, a dosage system, an acceleration sensor, a rotation rate sensor, a micro-positioning system, a micro-stabilizer or a micro-switch.

17. A MEMS comprising:
a substrate comprising a cavity;

a moveable element arranged in the cavity, the moveable element comprising a first electrode, a second electrode, and a third electrode that is arranged between the first electrode and the second electrode, the third electrode being fixed with the first electrode and the second electrode in an electrically insulated manner with a fixation at discrete areas;

wherein the moveable element is configured to perform a movement along a movement direction in a substrate plane in response to an electric potential between the first electrode and the third electrode or in response to an electric potential between the second electrode and the third electrode;

wherein the first electrode and the second electrode are spaced apart from the third electrode by means of a functional layer and are connected in a mechanically fixed manner at the discrete areas;

wherein an aspect ratio of a distance between the first electrode and the third electrode and a dimension of the first electrode along a direction perpendicular to the movement direction is larger than 100; or wherein an aspect ratio of a distance between the second electrode and the third electrode and a dimension of the second electrode along the direction perpendicular to the movement direction is larger than 100.

18. The MEMS according to claim 17, wherein at least one of the first electrode, the second electrode and the third electrode is connected to the substrate exclusively indirectly via a neighboring electrode.

* * * * *